US012772562B2

(12) United States Patent
Noh et al.

(10) Patent No.: US 12,772,562 B2
(45) Date of Patent: Oct. 20, 2026

(54) THIN FILM TRANSISTOR SUBSTRATE AND DISPLAY DEVICE COMPRISING THE SAME

(71) Applicant: LG Display Co., Ltd., Seoul (KR)

(72) Inventors: SoYoung Noh, Paju-si (KR); Seunghyo Ko, Paju-si (KR); KyeongJu Moon, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 567 days.

(21) Appl. No.: 17/902,655

(22) Filed: Sep. 2, 2022

(65) Prior Publication Data

US 2023/0081823 A1 Mar. 16, 2023

(30) Foreign Application Priority Data

Sep. 3, 2021 (KR) ........................ 10-2021-0117963
Dec. 31, 2021 (KR) ........................ 10-2021-0194207

(51) Int. Cl.
*H10D 86/60* (2025.01)
*H10D 86/01* (2026.01)
(Continued)

(52) U.S. Cl.
CPC ......... *H10D 86/60* (2025.01); *H10D 86/0221* (2025.01); *H10D 86/481* (2025.01);
(Continued)

(58) Field of Classification Search
CPC .. H10D 86/60; H10D 86/0221; H10D 86/481; H10D 86/423; H10D 86/441;
(Continued)

(56) References Cited

U.S. PATENT DOCUMENTS 9,093,405 B2 7/2015 Mo et al.
10,608,060 B2 3/2020 Kim et al.
(Continued)

FOREIGN PATENT DOCUMENTS

CN 104756253 A 7/2015
CN 107342323 A 11/2017
(Continued)

*Primary Examiner* — Jacob Y Choi
*Assistant Examiner* — Grace Cha
(74) *Attorney, Agent, or Firm* — Birch, Stewart, Kolasch & Birch, LLP

(57) ABSTRACT

A thin film transistor substrate can include a thin film transistor on a base substrate, and a capacitor connected to the thin film transistor. The thin film transistor can include an active layer on the base substrate, and a gate electrode spaced apart from the active layer to at least partially overlap the active layer. The capacitor can include a first capacitor electrode disposed on a same layer as the active layer of the thin film transistor, and a second capacitor electrode disposed on a same layer as the gate electrode and overlapping with the first capacitor electrode. The first capacitor electrode can include an active material layer made of a same material as the active layer of the thin film transistor, and a metal-containing layer disposed on the active material layer. The metal-containing layer can include a metal different than the active material layer and can absorb hydrogen.

20 Claims, 19 Drawing Sheets

(51) Int. Cl.
*H10D 86/40* (2025.01)
*H10K 59/126* (2023.01)

(52) U.S. Cl.
CPC ......... *H10D 86/423* (2025.01); *H10D 86/441* (2025.01); *H10K 59/126* (2023.02)

(58) Field of Classification Search
CPC ............. H10D 30/6723; H10D 86/421; H10K 59/126; H10K 59/1213; H10K 59/1216
See application file for complete search history.

(56) References Cited

U.S. PATENT DOCUMENTS

| | | | | |
|---|---|---|---|---|
| 2003/0011043 | A1* | 1/2003 | Roberts .................... | H10D 1/68<br>257/532 |
| 2015/0279871 | A1 | 10/2015 | Morosawa et al. | |
| 2017/0236888 | A1* | 8/2017 | Kim ................... | H10D 30/6734<br>438/34 |
| 2017/0317216 | A1 | 11/2017 | Lee et al. | |
| 2017/0365649 | A1* | 12/2017 | Kim ..................... | H10K 59/122 |
| 2018/0097047 | A1* | 4/2018 | Jung .................... | H10K 59/122 |
| 2018/0122882 | A1* | 5/2018 | Lee ...................... | H10K 59/124 |
| 2020/0144309 | A1* | 5/2020 | Jeon ..................... | H10D 86/411 |

FOREIGN PATENT DOCUMENTS

| | | | |
|---|---|---|---|
| CN | 107527934 | A | 12/2017 |
| KR | 10-2014-0135037 | A | 11/2014 |
| KR | 10-2017-0143082 | A | 12/2017 |
| KR | 10-2019-0088934 | A | 7/2019 |

* cited by examiner

THIN FILM TRANSISTOR SUBSTRATE AND DISPLAY DEVICE COMPRISING THE SAME

CROSS-REFERENCE TO RELATED APPLICATIONS

This application claims priority to the Korean Patent Application No. 10-2021-0117963 filed in the Republic of Korea on Sep. 3, 2021, and Korean Patent Application No. 10-2021-0194207 filed in the Republic of Korea on Dec. 31, 2021, the entire contents of all these applications being hereby incorporated by reference into the present Application.

BACKGROUND OF THE DISCLOSURE

Field of the Invention

The present disclosure relates to a thin film transistor substrate and a display device comprising the same.

Discussion of the Related Art

Since a thin film transistor can be manufactured on a glass substrate or a plastic substrate, the thin film transistor has been widely used as a switching element or a driving element of a display device, such as a liquid crystal display device or an organic light emitting device.

The thin film transistor can be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer, based on a material constituting the active layer.

Since an oxide semiconductor thin film transistor (TFT) has high mobility and can have a large resistance change in accordance with an oxygen content, the oxide semiconductor thin film transistor has an advantage in that desired properties can be easily obtained. Further, since an oxide constituting an active layer can be grown at a relatively low temperature during a process of manufacturing the oxide semiconductor thin film transistor, the manufacturing cost of the oxide semiconductor thin film transistor is reduced. Furthermore, in view of the properties of oxide, since an oxide semiconductor is transparent, it is favorable to embody a transparent display. However, the oxide semiconductor thin film transistor can have a problem in that stability and mobility are deteriorated as compared with the polycrystalline silicon thin film transistor. For instance, the stability and mobility of a thin film transistor and a storage capacitor Cst in a display device can deteriorate when they are exposed to hydrogen (H), especially when some process steps during manufacture of the display device may involve hydrogen or result in hydrogen off gassing.

Recently, with high quality and high resolution of a display device, it is desirable that a thin film transistor and a storage capacitor Cst, which are disposed in the display device, have excellent stability. In order for the thin film transistor and the storage capacitor Cst to have excellent stability, it is desirable for an oxide semiconductor layer included in the thin film transistor and the oxide semiconductor layer included in the storage capacitor Cst to have excellent resistance to hydrogen (H). For example, when there is unwanted hydrogen present within the device, it can cause chemical reactions that may damage or degrade various internal components, which can lead to impaired image quality and shorten the lifespan of the device.

SUMMARY OF THE DISCLOSURE

The present disclosure has been made in view of the above problems, and it is an object of the present disclosure to provide a method of improving stability of a capacitor and a thin film transistor.

It is another object of the present disclosure to provide a capacitor and a thin film transistor, which have excellent stability.

It is still another object of the present disclosure to provide a capacitor and a thin film transistor, which have excellent resistance to hydrogen (H).

It is further still another object of the present disclosure to provide a thin film transistor substrate comprising a capacitor and a thin film transistor, which have excellent stability.

It is further still another object of the present disclosure to provide a display device comprising the above thin film transistor substrate.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor substrate comprising a thin film transistor on a base substrate, and a capacitor connected to the thin film transistor, in which the thin film transistor includes an active layer on the base substrate, and a gate electrode spaced apart from the active layer to at least partially overlap the active layer, the capacitor includes a first capacitor electrode disposed on the same layer as the active layer, and a second capacitor electrode disposed on the same layer as the gate electrode and overlapped with the first capacitor electrode, and the first capacitor electrode includes an active material layer made of the same material as that of the active layer, and a metal-containing layer disposed on the active material layer, containing a metal, the metal-containing layer including a metal different from that of the active material layer.

The second capacitor electrode can be made of the same material as that of the gate electrode.

The active layer can be connected to one of the first capacitor electrode and the second capacitor electrode.

The active layer can be connected to the first capacitor electrode, and the gate electrode can be connected to the second capacitor electrode.

The active layer can be connected to the second capacitor electrode.

The capacitor can further include a third capacitor electrode disposed between the base substrate and the first capacitor electrode.

The thin film transistor substrate can further comprise a light shielding layer disposed between the base substrate and the active layer, in which the light shielding layer can be made of the same material as that of the third capacitor electrode.

The metal-containing layer can include a metal layer on the active material layer, and a metal oxide layer on the metal layer.

Each of the active layer and the active material layer can include an oxide semiconductor material.

The active layer and the active material layer can include a first oxide semiconductor layer, and a second oxide semiconductor layer on the first oxide semiconductor layer.

The metal-containing layer can include at least one selected from titanium (Ti), zirconium (Zr), hafnium (Hf), vanadium (V), niobium (Nb), tantalum (Ta), rubidium (Rb), cesium (Cs), magnesium (Mg), calcium (Ca), strontium (Sr), lanthanum (La), or palladium (Pd).

The active layer can include a channel portion, a first connection portion connected to one side of the channel portion, and a second connection portion connected to the other side of the channel portion, a reducing material layer can be disposed on the first connection portion and the second connection portion, and the reducing material layer can have the same composition as that of the metal-containing layer.

The reducing material layer on the second connection portion can be integrally formed with the metal-containing layer.

The active layer can be integrally formed with the active material layer of the first capacitor electrode.

The active layer can include a channel portion, a first connection portion connected to one side of the channel portion, and a second connection portion connected to the other side of the channel portion, and the first connection portion and the second connection portion can have a composition different from that of the active material layer.

The first connection portion and the second connection portion can include a dopant for ion doping.

The gate electrode can be integrally formed with the second capacitor electrode.

In accordance with another aspect of the present disclosure, the above and other objects can be accomplished by the provision of a display device comprising the above thin film transistor substrate.

The thin film transistor can be a driving transistor.

The thin film transistor can be a switching transistor.

The capacitor can be a storage capacitor formed between the gate electrode of the thin film transistor and the active layer of the thin film transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1A:
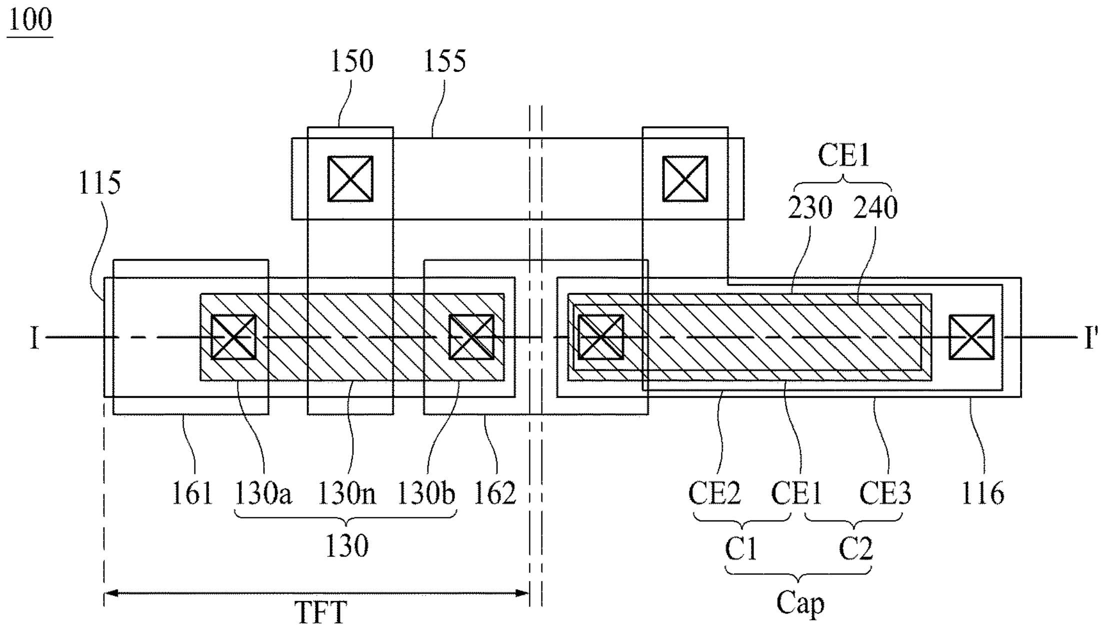
FIG. 1A is a plan view illustrating a thin film transistor substrate according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a situation where "comprise," "have," and "include" described in the present specification are used, another part may be added unless "only" is used. The terms of a singular form can include plural forms unless referred to the contrary.

In construing an element, the element is construed as including an error range although there is no explicit description.

In describing a position relationship, for example, when the position relationship is described as "upon," "above," "below," and "next to," one or more portions can be arranged between two other portions unless 'just' or 'direct' is used.

Spatially relative terms such as "below," "beneath," "lower," "above," and "upper" can be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device can be arranged "above" another device. Therefore, an exemplary term "below or beneath" can include "below or beneath" and "above" orientations. Likewise, an exemplary term "above" or "on" can include "above" and "below or beneath" orientations.

In describing a temporal relationship, for example, when the temporal order is described as "after," "subsequent," "next," and "before," a situation which is not continuous can be included, unless "just" or "direct" is used.

It will be understood that, although the terms "first," "second," etc. can be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode can be used interchangeably. The source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region can be a source electrode, and a drain region can be a drain electrode. Also, a source region can be a drain electrode, and a drain region can be a source electrode.

Figure 1B:
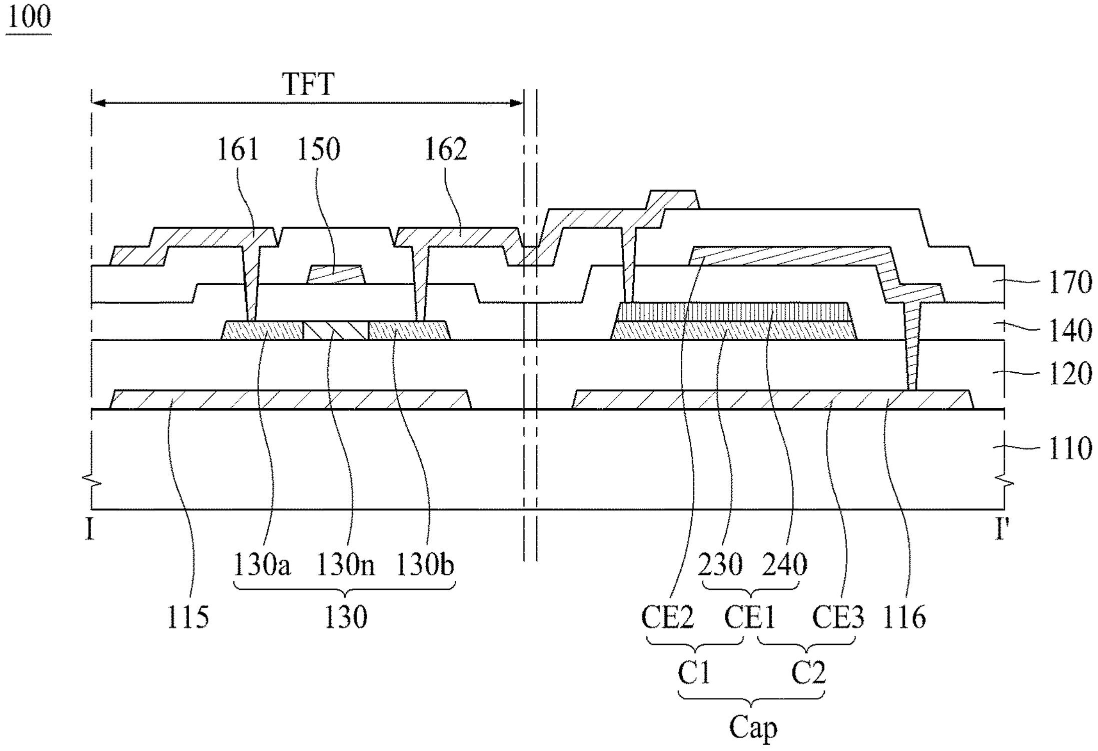
FIG. 1B is a cross-sectional view taken along line I-I' of FIG. 1A according to an embodiment of the present disclosure.

FIG. 1A is a plan view illustrating a thin film transistor substrate 100 according to an embodiment of the present disclosure, and FIG. 1B is a cross-sectional view taken along line I-I' of FIG. 1A according to an embodiment of the present disclosure.

The thin film transistor substrate 100 according to one embodiment of the present disclosure includes a thin film transistor TFT on a base substrate 110 and a capacitor Cap connected to the thin film transistor TFT.

Glass or plastic can be used as the base substrate 110. A transparent plastic, e.g., polyimide, which has a flexible property, can be used as the plastic. When the polyimide is used as the base substrate 110, a heat-resistant polyimide capable of enduring a high temperature can be used considering that a high temperature deposition process is performed on the base substrate 110.

Light shielding layers 115 and 116 can be disposed on the base substrate 110.

The light shielding layers 115 and 116 can shield light incident from the outside to protect the thin film transistor TFT.

The light shielding layers 115 and 116 can be made of a material having light shielding characteristics. The light shielding layers 115 and 116 can include at least one of an aluminum-based metal such as aluminum (Al) or an aluminum alloy, a molybdenum-based metal such as molybdenum (Mo) or a molybdenum alloy, chromium (Cr), tantalum (Ta), neodymium (Nd), titanium (Ti), or iron (Fe). According to one embodiment of the present disclosure, the light shielding layers 115 and 116 can have electrical conductivity.

The light shielding layers 115 and 116 can be electrically connected to one of a source electrode 161 and a drain electrode 162 of the thin film transistor TFT. In addition, the light shielding layers 115 and 116 can be electrically connected to a gate electrode 150.

Referring to FIGS. 1A and 1B, the light shielding layer 115 below the thin film transistor TFT can be connected to the source electrode 161 of the thin film transistor TFT. The light shielding layer 116 disposed in a direction of the capacitor Cap can be any one electrode of the capacitor Cap. Referring to FIG. 1B, the light shielding layer 116 disposed in a direction of the capacitor Cap can be a third capacitor electrode CE3.

A buffer layer 120 is disposed on the light shielding layers 115 and 116. The buffer layer 120 can be made of an insulating material. For example, the buffer layer 120 can include at least one insulating material, such as a silicon oxide, a silicon nitride, and a metal-based oxide. The buffer layer 120 can have a single layered structure, or can have a multi-layered structure.

The buffer layer 120 can protect the active layer 130 by blocking the air and water. Also, a surface of an upper portion of the base substrate 110 on which the light shielding layers 115 and 116 are disposed can be uniform by the buffer layer 120 (e.g., buffer layer 120 can provide a planarizing function).

Referring to FIG. 1B, the thin film transistor TFT can be disposed on the buffer layer 120. According to one embodiment of the present disclosure, the thin film transistor TFT includes an active layer 130 on the base substrate 110, and a gate electrode 150 spaced apart from the active layer 130 to at least partially overlap with the active layer 130.

Referring to FIG. 1B, the active layer 130 of the thin film transistor TFT can be disposed on the buffer layer 120.

According to one embodiment of the present disclosure, the active layer 130 can be formed by a semiconductor material. The active layer 130 can include, for example, an oxide semiconductor material.

The oxide semiconductor material can include, for example, at least one of an IZO(InZnO)-based oxide semiconductor material, an IGO(InGaO)-based oxide semiconductor material, an ITO(InSnO)-based oxide semiconductor material, an IGZO(InGaZnO)-based oxide semiconductor material, an IGZTO(InGaZnSnO)-based oxide semiconductor material, a GZTO(GaZnSnO)-based oxide semiconductor material, a GZO(GaZnO)-based oxide semiconductor material, an ITZO(InSnZnO)-based oxide semiconductor material, a FIZO(FeInZnO)-based oxide semiconductor material, a Ge-ITO-based oxide semiconductor material, or a Ge-ITZO-based oxide semiconductor material, but embodiments of the present disclosure are not limited thereto, and the active layer 130 can be made of another oxide semiconductor material known in the art.

The active layer 130 can include a channel portion **130*n*, a first connection portion 130*a*, and a second connection portion 130*b*. The first connection portion 130*a* is connected to one side of the channel portion 130*n*, and the second connection portion 130*b* is connected to the other side of the channel portion 130*n***.

The channel portion **130*n* overlaps with the gate electrode 150**.

The first connection portion **130*a* and the second connection portion 130*b* can be formed by selective conductorization of the active layer 130 made of a semiconductor material. For example, the active layer 130 can be selectively conductorized via doping by using the gate electrode 150 as a mask. As a result, the first connection portion 130*a* and the second connection portion 130*b* can be formed. In detail, the active layer 130** can be selectively conductorized by ion doping. Boron (B), phosphorus (P), fluorine (F), hydrogen (H) or their ions can be used as dopants for ion doping.

The first connection portion **130*a* and the second connection portion 130*b* have excellent electrical conductivity as compared with the channel portion 130*n*. Therefore, each of the first connection portion 130*a* and the second connection portion 130*b*** can serve as a line.

Referring to FIG. 1B, a first capacitor electrode CE1 can be disposed on the buffer layer 120. The first capacitor electrode CE1 can be disposed on the same layer as the active layer 130.

The first capacitor electrode CE1 can be electrically connected to the active layer 130, but embodiments of the present disclosure are not limited thereto, and the first capacitor electrode CE1 can be connected to the gate electrode 150.

The first capacitor electrode CE1 can include an active material layer 230 and a metal-containing layer 240.

Figure 9A:
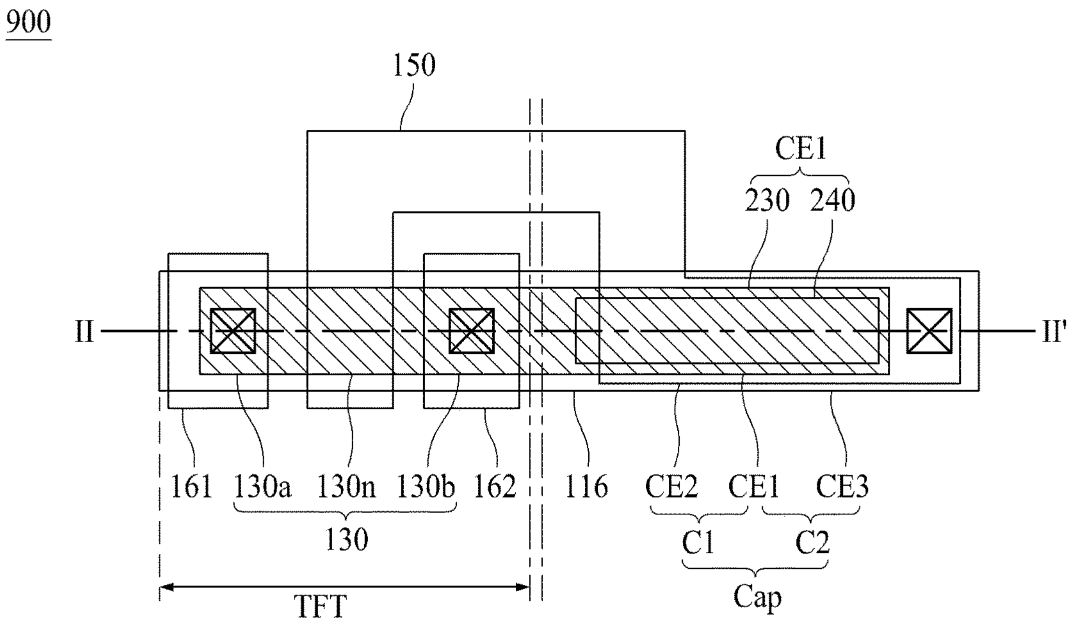
FIG. 9A is a cross-sectional view illustrating a thin film transistor substrate according to further still another embodiment of the present disclosure.
Figure 9B:
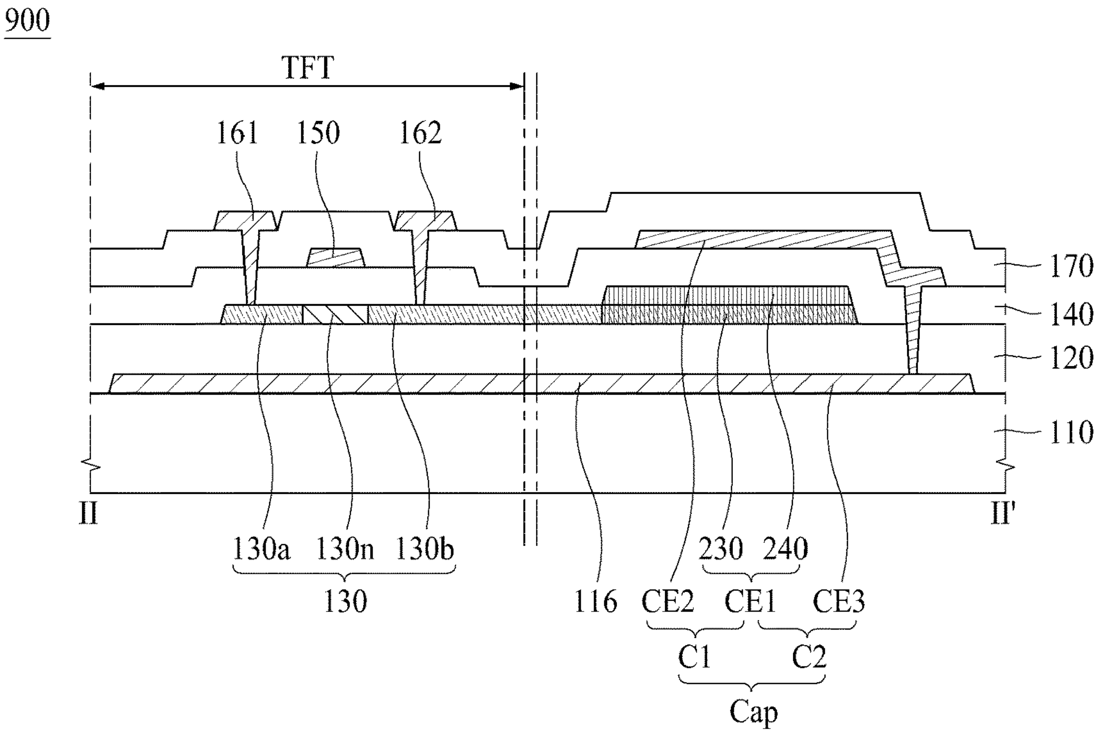
FIG. 9B is a cross-sectional view taken along line II-II' of FIG. 9A.

The active material layer 230 can be formed of the same material as that of the active layer 130. The active layer 130 and the active material layer 230 can be formed by the same oxide semiconductor material. The active layer 130 and the active material layer 230 can be integrally formed (e.g., the active layer 130 and the active material layer 230 can be laid down as a single layer or strip as shown in FIGS. 9A and 9B).

The metal-containing layer 240 is disposed on the active material layer 230, and includes a metal. The metal included in the metal-containing layer 240 can be different from the metal included in the active material layer 230. According to one embodiment of the present disclosure, the metal-containing layer 240 can include a different kind of metal than the active material layer 230.

The metal-containing layer 240 can include a metal having excellent reactivity with hydrogen (H). The metal contained in the metal-containing layer 240 can have a reductivity. In detail, as the metal contained in the metal-containing layer 240 is oxidized, another layer or another element can be reduced. In this way, the metal-containing layer 240 in the capacitor Cap can act as a hydrogen (H) sink that soaks up any extra hydrogen that is present in the device like sponge, in order to protect the active layer 130 in the thin film transistor TFT and other elements in the device from reacting with hydrogen and becoming degraded or destabilized. In some ways, the metal-containing layer 240 in the capacitor Cap can be considered as a type of sacrificial layer, but the metal-containing layer 240 can also provides an additional function of serving as a capacitor electrode to help improve the capacitance of the capacitor Cap. For example, unwanted hydrogen can be generated within the device due to various off gassing or certain manufacturing steps, and the metal-containing layer 240 can better protect internal components and improve the life span of the device.

According to one embodiment of the present disclosure, the metal-containing layer 240 can include at least one metal selected from titanium (Ti), zirconium (Zr), hafnium (Hf), vanadium (V), niobium (Nb), tantalum (Ta), rubidium (Rb), cesium (Cs), magnesium (Mg), calcium (Ca), strontium (Sr), lanthanum (La), or palladium (Pd).

The metal in the metal-containing layer 240 can be oxidized to be in a metal oxide state, and can be in a metal element state without being oxidized.

The metal-containing layer 240 can include, for example, titanium (Ti) as a metal. Titanium (Ti) can more easily react with hydrogen in a titanium oxide (TiOx, $0<x\leq 2$) state that is oxidized, than when it is in a titanium (Ti) atom state that is not oxidized. A reaction energy relation of titanium (Ti), titanium oxide (TiOx) and hydrogen is as shown in Table 1.

TABLE 1

| Reaction formula | Formation Energy(eV) |
| --- | --- |
| $TiH_2$ | −0.584 |
| TiH | −0.438 |
| $Ti_6H_2O_{13}$ | −3.188 |
| $Ti_3H_2O_7$ | −2.954 |

In Table 1, "formation energy" refers to Gibb's free energy.

Referring to Table 1, it is noted that titanium (Ti) has lower reaction energy with hydrogen in a titanium oxide (TiOx) state than in a monoatomic state, and as a result, titanium can easily react with hydrogen. For example, the extra oxygen atoms that are present in titanium oxide can allow it to more easily bond with hydrogen.

According to one embodiment of the present disclosure, the metal-containing layer 240 can include a metal oxide that can easily react with hydrogen (H). As a result, the metal-containing layer 240 can better capture hydrogen (H) to prevent hydrogen (H) from undesirably affecting the active layer 130 of the thin film transistor TFT. According to one embodiment of the present disclosure, the metal-containing layer 240 can serve as a hydrogen (H) capturing layer or a hydrogen (H) absorbing layer to protect the active layer 130 of the thin film transistor TFT (e.g., metal-containing layer 240 can act as a hydrogen sink/sponge). In more detail, the metal-containing layer 240 can protect the channel portion 130*n* of the active layer 130.

According to one embodiment of the present disclosure, the metal-containing layer 240 includes a metal oxide, but can have electrical conductivity. Thus, the metal-containing layer 240 can serve as a conductive material layer.

According to one embodiment of the present disclosure, the metal-containing layer 240 can have electrical conductivity. For example, the metal-containing layer 240 can have a surface resistance of 10,000 Ω/□ or less. In more detail, the metal-containing layer 240 can have a surface resistance of 5,000 Ω/□ or less, can have a surface resistance of 1500 Ω/□ or less, can have a surface resistance of 1,300 Ω/□ or less, and can have a surface resistance of 1050 Ω/□ or less. The metal-containing layer 240 can have a surface resistance of, for example, 500 to 5,000 Ω/□, can have a surface resistance of 1,000 to 5,000 Ω/□, have a surface resistance of 1,000 to 1,500 Ω/□, have a surface resistance of 1,000 to 1,300 Ω/□, and can have a surface resistance of 950 to 1050 Ω/□, and can have a surface resistance of 500 to 1,500 Ω/□.

A gate insulating layer 140 is disposed on the active layer 130 and the first capacitor electrode CE1. The gate insulating layer 140 can be formed of at least one of a silicon oxide, a silicon nitride or a metal-based oxide. The gate insulating layer 140 can have a single layered structure, or can have a multi-layered structure. The gate insulating layer 140 protects the channel portion 130*n*.

Referring to FIG. 1B, the gate insulating layer 140 can be integrally formed on the base substrate 110. For example, the gate insulating layer 140 can cover both of upper portions of the active layer 130 and the first capacitor electrode CE1, but embodiments of the present disclosure are not limited thereto, and the gate insulating layer 140 can be patterned (see FIG. 2B).

The gate electrode 150 is disposed on the gate insulating layer 140. The gate electrode 150 is spaced apart from the active layer 130 to at least partially overlap the active layer 130. At least a portion of the gate electrode 150 overlaps the channel portion 130*n* of the active layer 130.

Referring to FIG. 1B, a second capacitor electrode CE2 can be disposed on the gate insulating layer 140. The second capacitor electrode CE2 can be disposed on the same layer as the gate electrode 150. The second capacitor electrode CE2 can be made of the same material as that of the gate electrode 150. The gate electrode 150 and the second capacitor electrode CE2 can be formed together.

Each of the gate electrode 150 and the second capacitor electrode CE2 can include at least one of an aluminum-based metal, such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). Each of the gate electrode 150 and the second capacitor electrode CE2 can have a multi-layered structure that includes at least two conductive layers having different physical properties.

The second capacitor electrode CE2 overlaps the first capacitor electrode CE1. A first capacitor C1 can be formed by the first capacitor electrode CE1 and the second capacitor electrode CE2. The first capacitor C1 can constitute the capacitor Cap according to one embodiment of the present disclosure.

Referring to FIGS. 1A and 1B, the second capacitor electrode CE2 can be connected to the light shielding layer 116 disposed below the first capacitor electrode CE1 through a contact hole. Therefore, the same voltage as that of the second capacitor electrode CE2 can be applied to the light shielding layer 116.

The light shielding layer 116 connected to the second capacitor electrode CE2 can be a third capacitor electrode CE3. For example, the light shielding layer 116 can provide dual functions of both blocking light and serving as a capacitor electrode for increasing capacitance of the capacitor Cap. Referring to FIG. 1B, the capacitor Cap can include a third capacitor electrode CE3 (e.g., light shielding layer 116) disposed between the base substrate 110 and the first capacitor electrode CE1.

The third capacitor electrode CE3 overlaps the first capacitor electrode CE1. A second capacitor C2 can be formed by the first capacitor electrode CE1 and the third capacitor electrode CE3. The second capacitor C2 can constitute the capacitor Cap according to one embodiment of the present disclosure. According to one embodiment of the present disclosure, the capacitor Cap can include the first capacitor C1 and the second capacitor C2.

The light shielding layer 115 disposed between the base substrate 110 and the active layer 130 is disposed on the same layer as the third capacitor electrode CE3. The light shielding layer 115 disposed between the base substrate 110 and the active layer 130 can be formed of the same material as that of the third capacitor electrode CE3, and the light shielding layer 115 can be formed together with the third capacitor electrode CE3 (e.g., light shielding layer 115 and third capacitor electrode CE3 can be laid down during the same processing step).

An interlayer insulating layer 170 is disposed on the gate electrode 150 and the second capacitor electrode CE2. The interlayer insulating layer 170 can include at least one of a silicon oxide, a silicon nitride, or a metal-based oxide. The interlayer insulating layer 170 can have a single layered structure, or can have a multi-layered structure.

A source electrode 161 and a drain electrode 162 can be disposed on the interlayer insulating layer 170. The source electrode 161 and the drain electrode 162 are spaced apart from each other and connected to the active layer 130, respectively. The source electrode 161 and the drain electrode 162 can be made of a conductive material.

The source electrode 161 and the drain electrode 162 are only distinguished for convenience, and can be used interchangeably.

Referring to FIG. 1B, the source electrode 161 and the drain electrode 162 are connected to the active layer 130 through a contact hole, respectively. The source electrode 161 can be connected to the light shielding layer 115 below the active layer 130 through the contact hole. Alternatively, the drain electrode 162 can be connected to the light shielding layer 115 below the active layer 130 through the contact hole, and the gate electrode 150 can be connected to the light shielding layer 115 below the active layer 130.

According to one embodiment of the present disclosure, the capacitor Cap can be connected to the thin film transistor TFT. In detail, the active layer 130 of the thin film transistor TFT can be connected to any one of the first capacitor electrode CE1 and the second capacitor electrode CE2.

The active layer 130 is connected to the first capacitor electrode CE1 in FIGS. 1A and 1B. In detail, the active layer 130 and the first capacitor electrode CE1 can be connected to each other through the drain electrode 162, but embodiments of the present disclosure are not limited thereto, and the active layer 130 and the first capacitor electrode CE1 can be connected to each other through the source electrode 161.

Referring to FIG. 1A, the gate electrode 150 can be connected to the second capacitor electrode CE2. In detail, the gate electrode 150 and the second capacitor electrode CE2 can be connected to each other by a connection electrode 155.

However, one embodiment of the present disclosure is not limited to the above example. The active layer 130 can be connected to the second capacitor electrode CE2 instead of the first capacitor electrode CE1.

According to one embodiment of the present disclosure, the capacitor Cap connected to the thin film transistor TFT can serve as a storage capacitor Cst for charging a voltage for controlling light emission of a pixel.

Figure 2A:
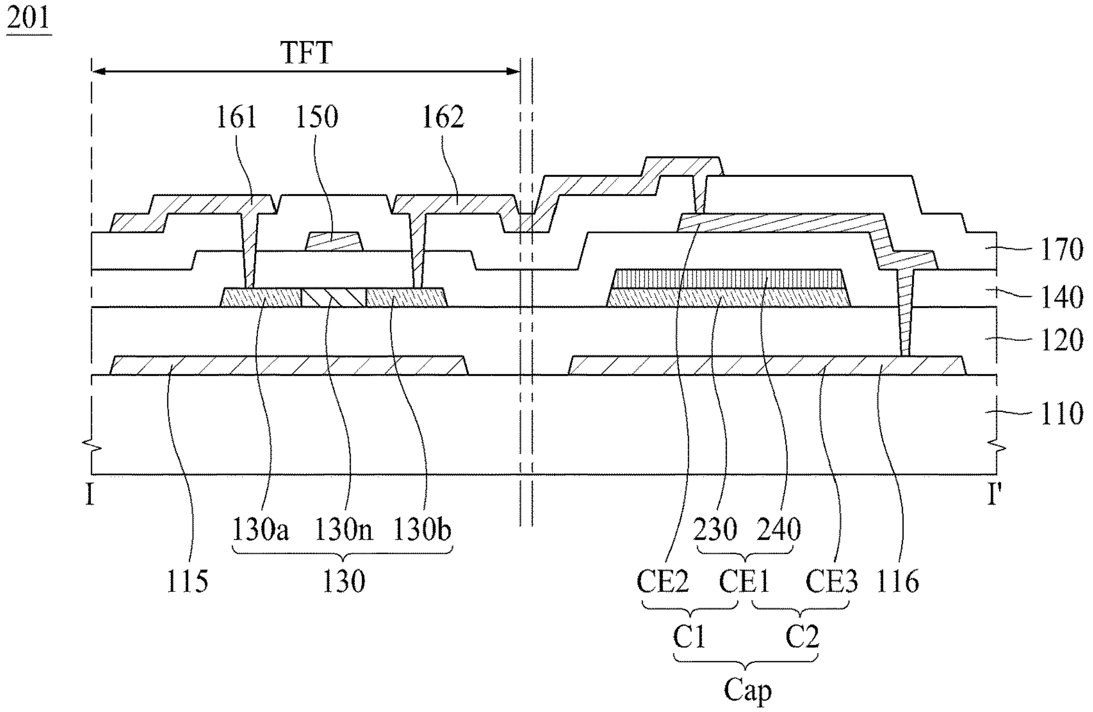
FIGS. 2A and 2B are cross-sectional views illustrating a thin film transistor substrate according to another embodiment of the present disclosure.
Figure 2B:
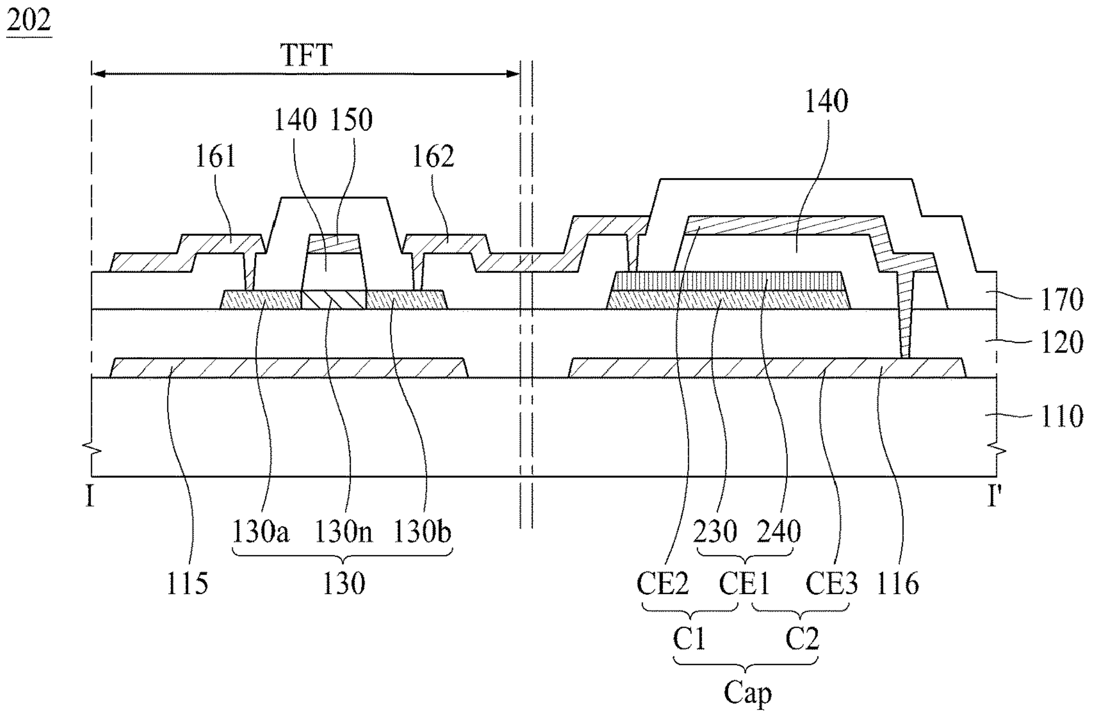

FIGS. 2A and 2B are cross-sectional views illustrating thin film transistor substrates 201 and 202 according to another embodiment of the present disclosure. Hereinafter, in order to avoid redundancy, a description of the elements already described will be omitted.

Referring to FIG. 2A, the active layer 130 can be connected to the second capacitor electrode CE2 of the capacitor Cap. The active layer 130 and the second capacitor electrode CE2 can be connected to each other by the drain electrode 162. Referring to FIGS. 1B and 2A, the active layer 130 can be connected to the first capacitor electrode CE1 of the capacitor Cap, and can be also connected to the second capacitor electrode CE2. Hereinafter, in other embodiments described below, the active layer 130 can be connected to the first capacitor electrode CE1, and can be also connected to the second capacitor electrode CE2.

Referring to FIG. 2B, the gate insulating layer 140 can be patterned. In detail, the gate insulating layer 140 can be patterned in a shape corresponding to the gate electrode 150 (e.g., in an island shape under the gate) and the second capacitor electrode CE2. Hereinafter, in other embodiments described below, the gate insulating layer 140 can be patterned.

When the gate insulating layer 140 is patterned, the active layer 130 can be selectively conductorized so that the first connection portion 130*a* and the second connection portion 130*b* can be formed.

Figure 3:
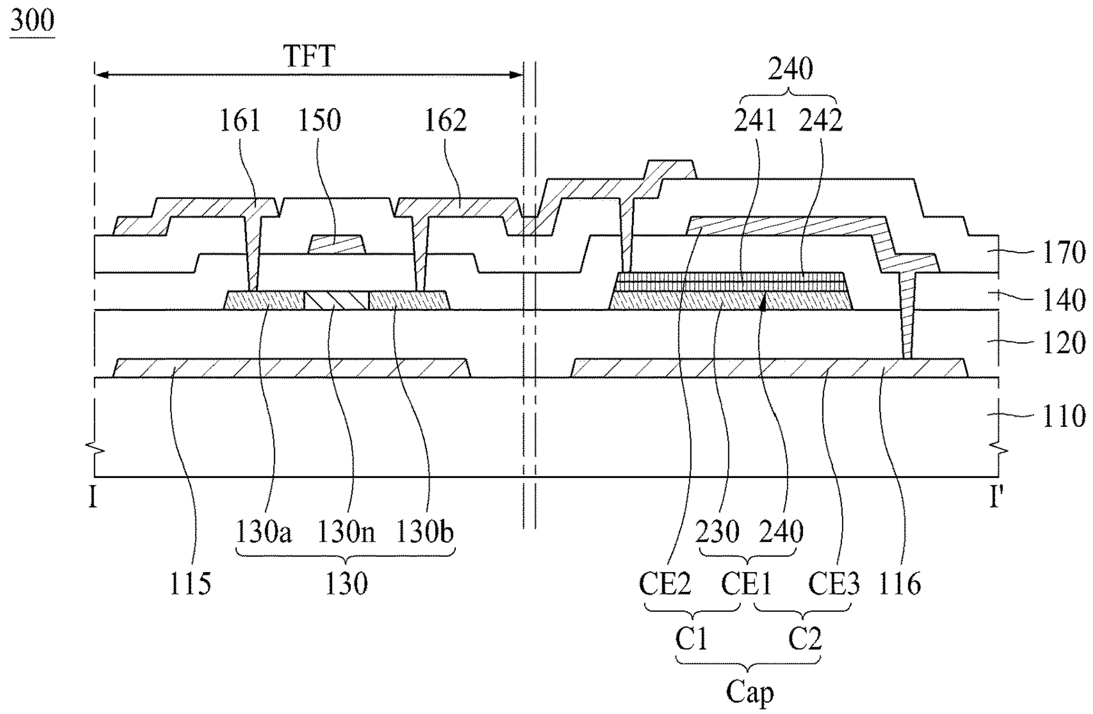
FIG. 3 is a cross-sectional view illustrating a thin film transistor substrate according to still another embodiment of the present disclosure.

FIG. 3 is a cross-sectional view illustrating a thin film transistor substrate 300 according to still another embodiment of the present disclosure.

Referring to FIG. 3, the metal-containing layer 240 can include a metal layer 241 on the active material layer 230 and a metal oxide layer 242 on the metal layer 241. The metal oxide layer 242 has an oxygen concentration higher than that of the metal layer 241.

According to one embodiment of the present disclosure, a portion of the metal-containing layer 240, which is made of a metal that is not substantially oxidized or is hardly oxidized, can be referred to as the metal layer 241. After the metal-containing layer 240 is formed using a metal, a heat treatment or an oxygen ($O_2$) plasma treatment can be performed for the metal-containing layer 240, whereby the metal layer 241 and the metal oxide layer 242 can be formed separately.

According to one embodiment of the present disclosure, the metal layer 241 can be made of only a metal, but can include a small amount of oxygen. A portion of the metal-containing layer 240, which has an oxygen concentration of 10 at % or less relative to a total number of atoms, can be referred to as the metal layer 241. Alternatively, the metal layer 241 can have an oxygen concentration of 5 at % or less.

The metal layer 241 can have reductivity. The metal layer 241 can reduce the active material layer 230. As a result, the active material layer 230 can be reduced so that the active material layer 230 can have electrical conductivity close to a conductor.

The metal oxide layer 242 can easily react with hydrogen. As a result, the metal oxide layer 242 can serve as a hydrogen capturing layer or a hydrogen blocking layer. The metal oxide layer 242 can serve to prevent hydrogen (H) from unnecessarily affecting the active layer 130 of the thin film transistor TFT.

Figure 4:
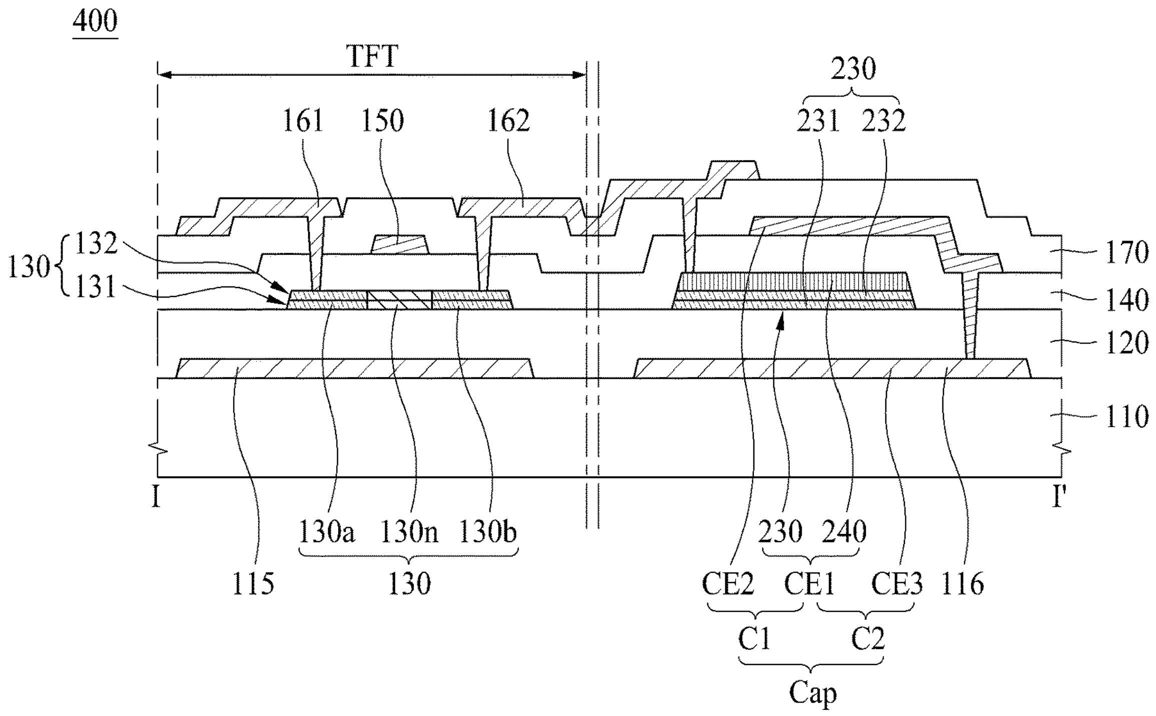
FIG. 4 is a cross-sectional view illustrating a thin film transistor substrate according to further still another embodiment of the present disclosure.

FIG. 4 is a cross-sectional view illustrating a thin film transistor substrate 400 according to further still another embodiment of the present disclosure.

Referring to FIG. 4, the active layer 130 of the thin film transistor TFT can include a first oxide semiconductor layer 131 and a second oxide semiconductor layer 132 on the first oxide semiconductor layer 131.

Referring to FIG. 4, the active material layer 230 of the first capacitor electrode CE1 can also include a first oxide semiconductor layer 231 and a second oxide semiconductor layer 232 on the first oxide semiconductor layer 231.

According to another embodiment of the present disclosure, the active layer 130 and the active material layer 230 can be made together by the same process using the same material. Therefore, the first oxide semiconductor layer 131 of the active layer 130 and the first oxide semiconductor layer 231 of the active material layer 230 can have the same composition. In addition, the second oxide semiconductor layer 132 of the active layer 130 and the second oxide semiconductor layer 232 of the active material layer 230 can have the same composition.

The first oxide semiconductor layers 131 and 231 and the second oxide semiconductor layers 132 and 232 can include the same semiconductor material, and can include their respective semiconductor materials different from each other.

The first oxide semiconductor layers 131 and 231 support the second oxide semiconductor layers 132 and 232. Therefore, the first oxide semiconductor layers 131 and 231 are also referred to as support layers.

A structure in which the active layer 130 and the active material layer 230 are formed of two layers is also referred to as a bi-layer structure, but another embodiment of the present disclosure is not limited thereto, and the active layer 130 and the active material layer 230 can further include a third oxide semiconductor layer.

The stacked structure of the active layer 130 and the active material layer 230, which are shown in FIG. 4, can be applied to other thin film transistors described herein.

Figure 5:
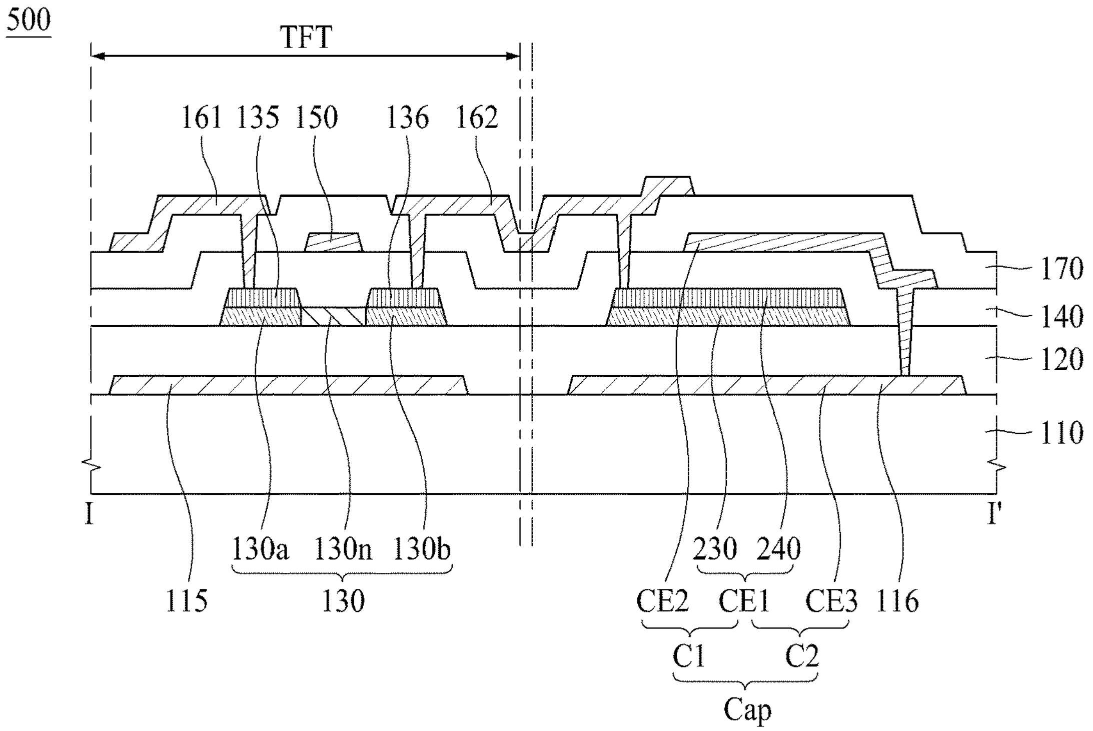
FIG. 5 is a cross-sectional view illustrating a thin film transistor substrate according to further still another embodiment of the present disclosure.

FIG. 5 is a cross-sectional view illustrating a thin film transistor substrate 500 according to further still another embodiment of the present disclosure.

Referring to FIG. 5, reducing material layers 135 and 136 can be disposed on the first connection portion 130*a* and the second connection portion 130*b*. The reducing material layers 135 and 136 can have the same composition as that of the metal-containing layer 240. The reducing material layers 135 and 136 can be formed together by the same process using the same material as the metal-containing layer 240. Thus, the reducing material layers 135 and 136 and the metal-containing layer 240 can be comprised of the same material, and can have the same material composition.

Referring to FIG. 5, the first reducing material layer 135 can be disposed on the first connection portion 130*a*, and the second reducing material layer 136 can be disposed on the second connection portion 130*b*.

In the same manner as the metal-containing layer 240, the reducing material layers 135 and 136 can include at least one selected from titanium (Ti), zirconium (Zr), hafnium (Hf), vanadium (V), niobium (Nb), tantalum (Ta), rubidium (Rb), cesium (Cs), magnesium (Mg), calcium (Ca), strontium (Sr), lanthanum (La), or palladium (Pd).

The reducing material layers 135 and 136 can include a metal oxide, and can easily react with hydrogen (H). As a result, the reducing material layers 135 and 136 can prevent hydrogen (H) from unnecessarily affecting the channel portion 130*n* of the active layer 130.

In addition, the active layer 130 can be selectively conductorized by the reducing material layers 135 and 136. According to one embodiment of the present disclosure, an area of the active layer 130, which is in contact with the reducing material layers 135 and 136, can be conductorized, whereby the first connection portion 130*a* and the second connection portion 130*b* can be formed, respectively.

In detail, portions of the active layer 130, which are in contact with the reducing material layers 135 and 136, can be reduced to form the first connection portion 130*a* and the second connection portion 130*b*.

Figure 6:
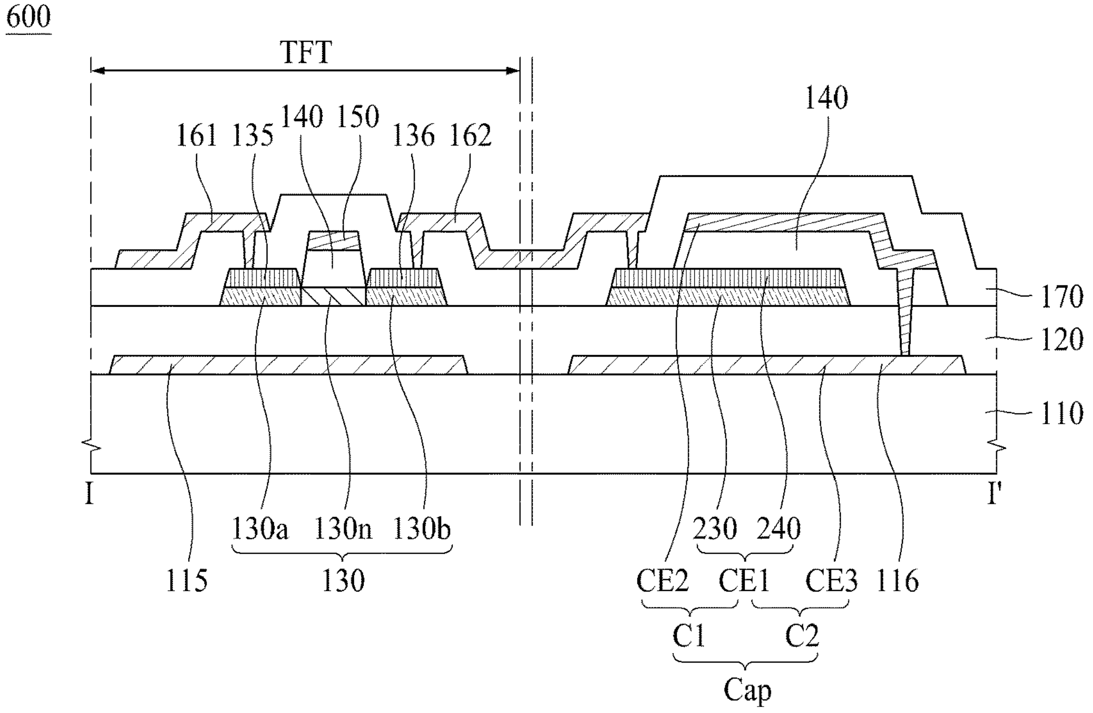
FIG. 6 is a cross-sectional view illustrating a thin film transistor substrate according to further still another embodiment of the present disclosure.

FIG. 6 is a cross-sectional view illustrating a thin film transistor substrate 600 according to further still another embodiment of the present disclosure.

Referring to FIG. 6, the gate insulating layer 140 can be patterned. In detail, the gate insulating layer 140 can be patterned in a shape corresponding to the gate electrode 150 and the second capacitor electrode CE2.

Referring to FIG. 6, the active layer 130 can be connected to the first capacitor electrode CE1 of the capacitor Cap. The active layer 130 and the first capacitor electrode CE1 can be connected to each other by the drain electrode 162, but further still another embodiment of the present disclosure is not limited thereto, and the active layer 130 can be connected to the second capacitor electrode CE2.

Figure 7:
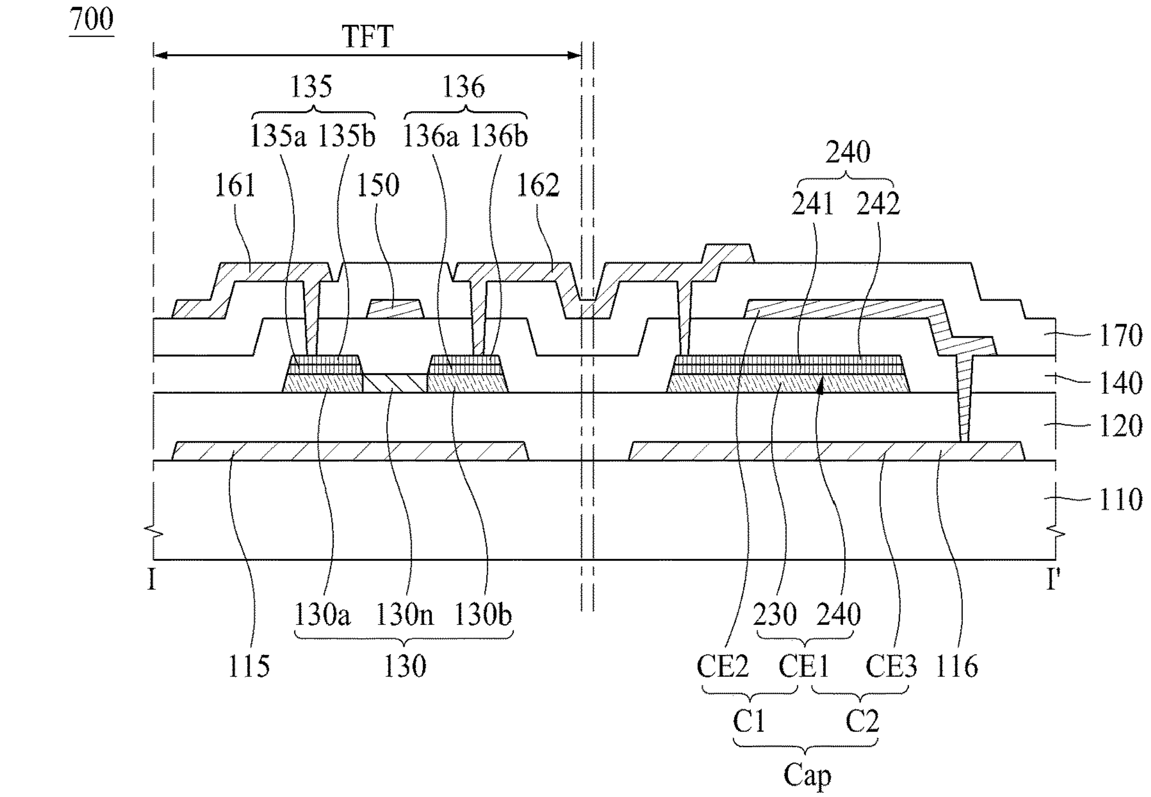
FIG. 7 is a cross-sectional view illustrating a thin film transistor substrate according to further still another embodiment of the present disclosure.

FIG. 7 is a cross-sectional view illustrating a thin film transistor substrate 700 according to further still another embodiment of the present disclosure.

Referring to FIG. 7, the reducing material layers 135 and 136 can include metal layers 135*a* and 136*a* and metal oxide layers 135*b* and 136*b* on the metal layers 135*a* and 136*a*.

The metal oxide layers 135*b* and 136*b* have an oxygen concentration higher than that of the metal layers 135*a* and 136*a*. The metal layers 135*a* and 136*a* can have reductivity. The metal layers 135*a* and 136*a* can reduce the active layer 130. As a result, the active layer 230 can be reduced so that the active layer 130 can be selectively conductorized.

According to further still another example embodiment of the present disclosure, an area of the active layer 130, which is in contact with the metal layers 135*a* and 136*a*, can be conductorized, whereby the first connection portion 130*a* and the second connection portion 130*b* can be formed.

The metal-containing layer 240 can include a metal layer 241 on the active material layer 230 and a metal oxide layer 242 on the metal layer 241. The metal oxide layer 242 has an oxygen concentration higher than that of the metal layer 241.

The reducing material layers 135 and 136 and the metal-containing layer 240 can be formed together by the same method using the same material.

Figure 8:
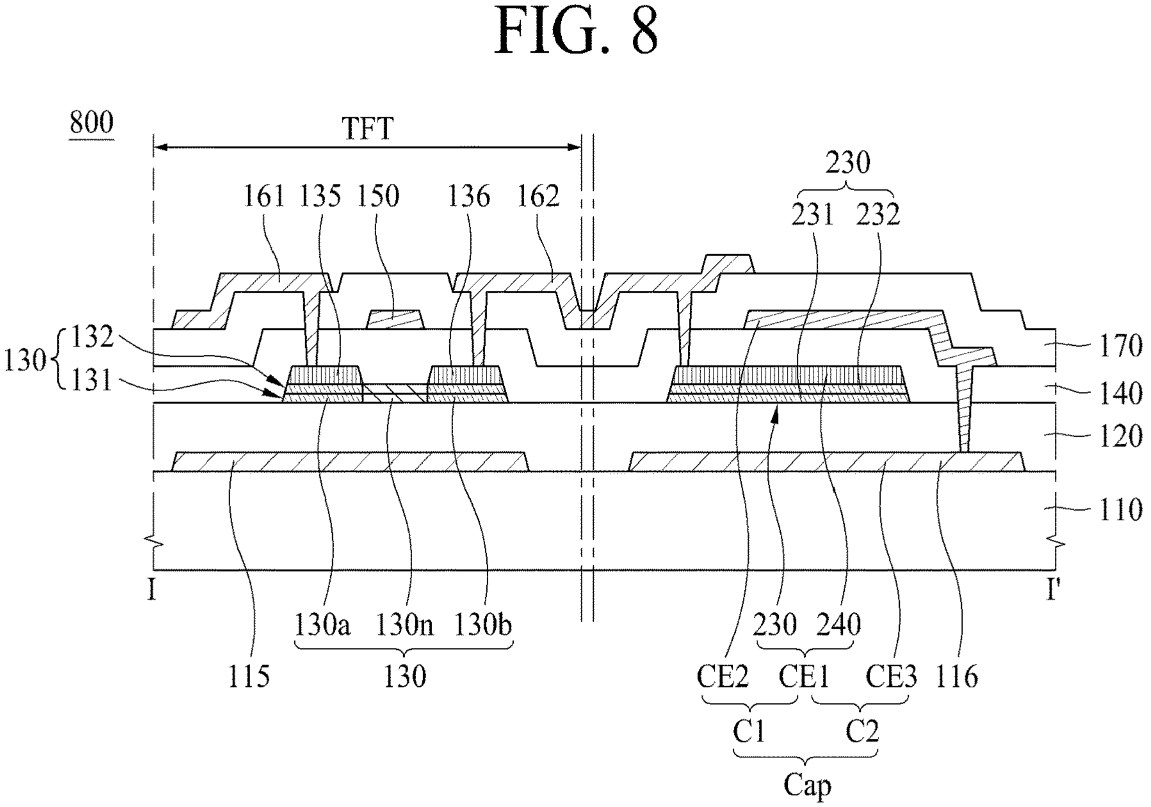
FIG. 8 is a cross-sectional view illustrating a thin film transistor substrate according to further still another embodiment of the present disclosure.

FIG. 8 is a cross-sectional view illustrating a thin film transistor substrate 800 according to further still another embodiment of the present disclosure.

Referring to FIG. 8, the active layer 130 of the thin film transistor TFT can include a first oxide semiconductor layer 131 and a second oxide semiconductor layer 132 on the first oxide semiconductor layer 131. The reducing material layers 135 and 136 can be disposed on the second oxide semiconductor layer 132.

Referring to FIG. 8, the active material layer 230 of the first capacitor electrode CE1 can also include a first oxide semiconductor layer 231 and a second oxide semiconductor layer 232 on the first oxide semiconductor layer 231.

FIG. 9A is a cross-sectional view illustrating a thin film transistor substrate 900 according to further still another embodiment of the present disclosure, and FIG. 9B is a cross-sectional view taken along line II-II' of FIG. 9A.

Referring to FIGS. 9A and 9B, the active layer 130 of the thin film transistor TFT can be integrated with the active material layer 230 of the first capacitor electrode CE1. According to further still another embodiment of the present disclosure, the active layer 130 of the thin film transistor TFT and the active material layer 230 of the first capacitor electrode CE1 can be formed of a single pattern (e.g., the same strip of material can be laid down for serving as the active layer of the TFT and a capacitor electrode of the capacitor Cap).

The area except for the channel portion 130*n* of the active layer 130 and the active material layer 230 can be conductorized. As a result, the active layer 130 and the active material layer 230 can be electrically connected to each other without a separate connection line.

Referring to FIGS. 9A and 9B, the metal-containing layer 240 can be disposed only on the active material layer 230 of the first capacitor electrode CE1 (e.g., the hydrogen absorbing layer can be disposed only in the capacitor area). Alternatively, the hydrogen absorbing layer can be disposed in both of the capacitor area and the TFT area (e.g., see FIG. 11).

Referring to FIG. 9A, the gate electrode 150 can be integrally formed with the second capacitor electrode CE2. According to further still another embodiment of the present disclosure, the gate electrode 150 of the thin film transistor TFT and the second capacitor electrode CE2 can be formed of a single pattern. As a result, the gate electrode 150 can be connected to the second capacitor electrode CE2 without the connection electrode 155. For example, active material layer 230 and light shielding layer 116 can extend across both of the thin film transistor TFT area and the capacitor area, which can simplify wiring and reduce the foot print of the pixel circuit.

Referring to FIGS. 9A and 9B, the light shielding layer 116 can be integrally formed below the thin film transistor TFT and the capacitor Cap. One light shielding layer 116 can be disposed below the thin film transistor TFT and the capacitor Cap.

The light shielding layer 116 can be connected to the second capacitor electrode CE2. As a result, the light shielding layer 116 can be electrically connected to the gate electrode 150.

A portion of the light shielding layer 116, which is disposed below the capacitor Cap, can be a third capacitor electrode CE3. The same voltage as that of the second capacitor electrode CE2 can be applied to the third capacitor electrode CE3.

According to further still another embodiment of the present disclosure, the first connection portion 130*a* and the second connection portion 130*b* can be conductorized by ion doping using a dopant. Boron (B), phosphorus (P), fluorine (F), hydrogen (H) or their ions can be used as dopants for ion doping. Therefore, the first connection portion 130*a* and the second connection portion 130*b* can include a dopant for ion doping. On the other hand, since the active material layer 230 is shielded by the metal-containing layer 240, the active material layer 230 may not include a dopant used for ion doping. In this way, even though the first connection portion 130*a* and the second connection portion 130*b* are formed by the active layer 130 and the active material layer 230, as a result of ion doping, each of the first connection portion 130*a* and the second connection portion 130*b* can have a composition different from that of the active material layer 230.

Figure 10:
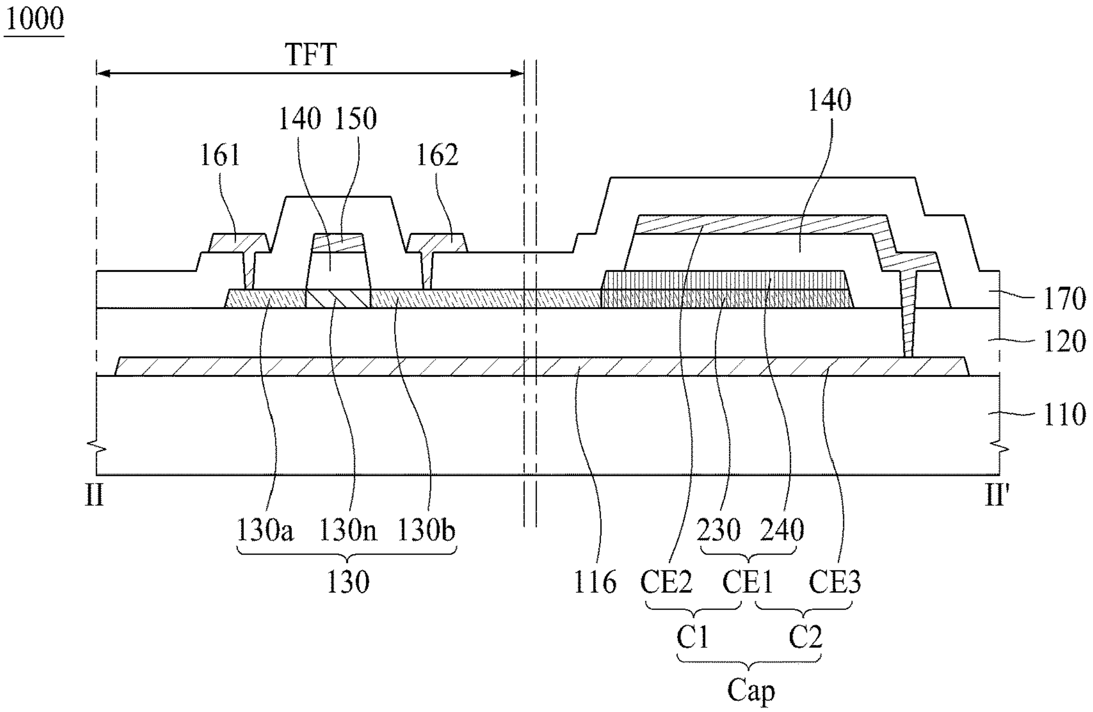
FIG. 10 is a cross-sectional view illustrating a thin film transistor substrate according to further still another embodiment of the present disclosure.

FIG. 10 is a cross-sectional view illustrating a thin film transistor substrate 1000 according to further still another embodiment of the present disclosure.

Referring to FIG. 10, the gate insulating layer 140 can be patterned. In detail, the gate insulating layer 140 can be patterned in a shape corresponding to the gate electrode 150 and the second capacitor electrode CE2.

When the gate insulating layer 140 is patterned, the active layer 130 can be selectively conductorized so that the first connection portion 130*a* and the second connection portion 130*b* can be formed.

Referring to FIG. 10, the active layer 130 and the active material layer 230 can be integrally formed.

Figure 11:
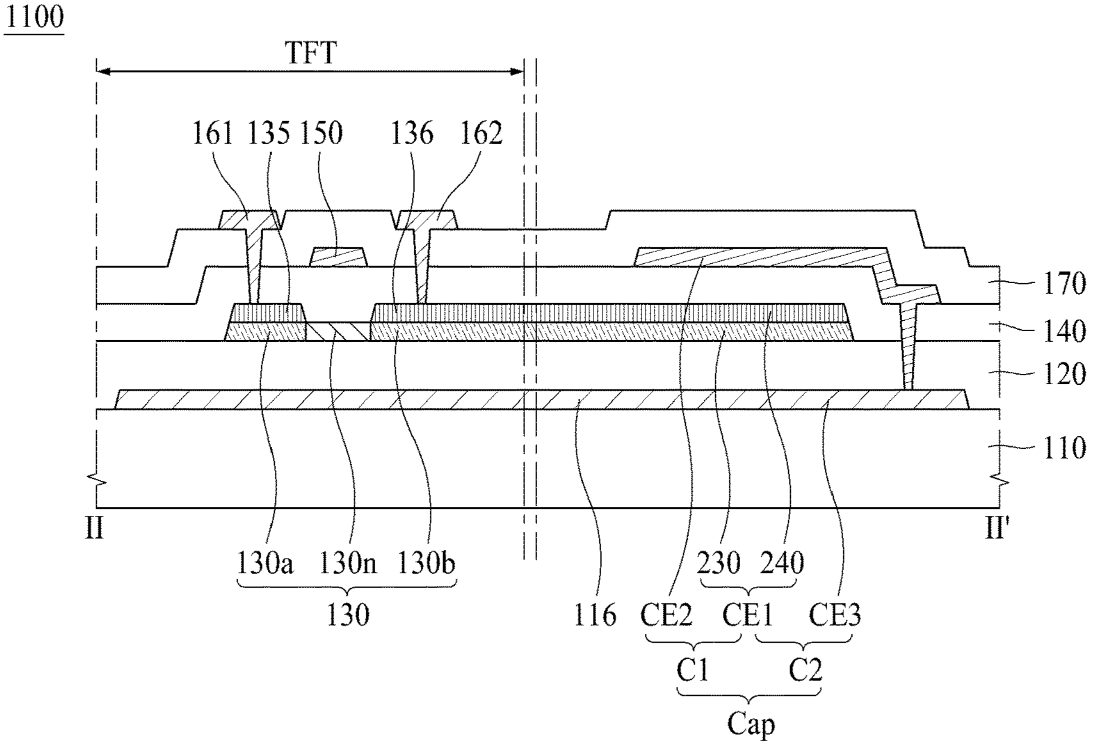
FIG. 11 is a cross-sectional view illustrating a thin film transistor substrate according to further still another embodiment of the present disclosure.

FIG. 11 is a cross-sectional view illustrating a thin film transistor substrate 1100 according to further still another embodiment of the present disclosure.

Referring to FIG. 11, reducing material layers 135 and 136 can be disposed on the first connection portion 130*a* and the second connection portion 130*b* of the thin film transistor TFT, and a metal-containing layer 240 can be disposed on the active material layer 230 of the first capacitor electrode CE1.

The reducing material layers 135 and 136 can be formed together by the same process using the same material as that of the metal-containing layer 240.

The reducing material layer 136 on the second connection portion 130*b* can be integrally formed with the metal-containing layer 240. The reducing material layer 136 can be extended to become the metal-containing layer 240. Alternatively, a portion of the metal-containing layer 240 can be the reducing material layer 136 on the second connection portion 130*b*.

Figure 12:
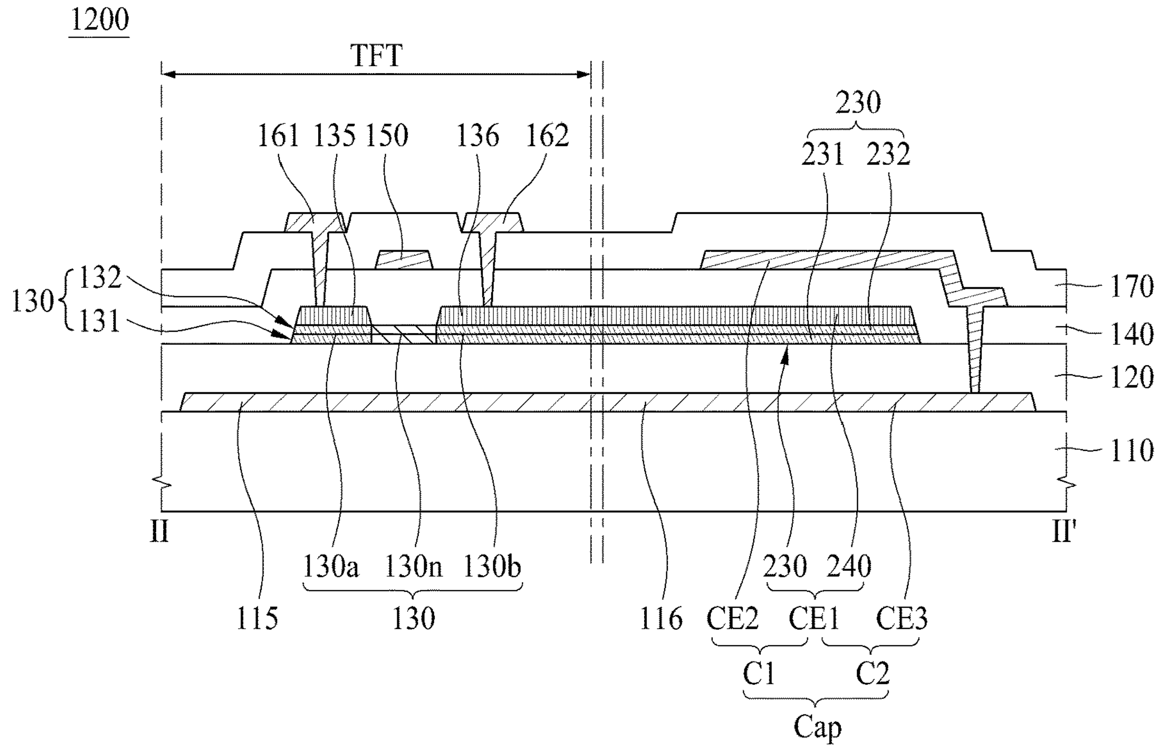
FIG. 12 is a cross-sectional view illustrating a thin film transistor substrate according to further still another embodiment of the present disclosure.

FIG. 12 is a cross-sectional view illustrating a thin film transistor substrate 1200 according to further still another embodiment of the present disclosure.

Referring to FIG. 12, the active layer 130 of the thin film transistor TFT can include a first oxide semiconductor layer 131 and a second oxide semiconductor layer 132 on the first oxide semiconductor layer 131. The active material layer 230 of the first capacitor electrode CE1 can also include a first oxide semiconductor layer 231 and a second oxide semiconductor layer 232 on the first oxide semiconductor layer 231.

Referring to FIG. 12, the first oxide semiconductor layer 131 of the active layer 130 and the first oxide semiconductor layer 231 of the active material layer 230 can be integrally formed. In addition, the second oxide semiconductor layer 132 of the active layer 130 and the second oxide semiconductor layer 232 of the active material layer 230 can be integrally formed. Also, the first oxide semiconductor layer 231 can have a higher oxygen concentration than the second oxide semiconductor layer 132.

Figure 13:
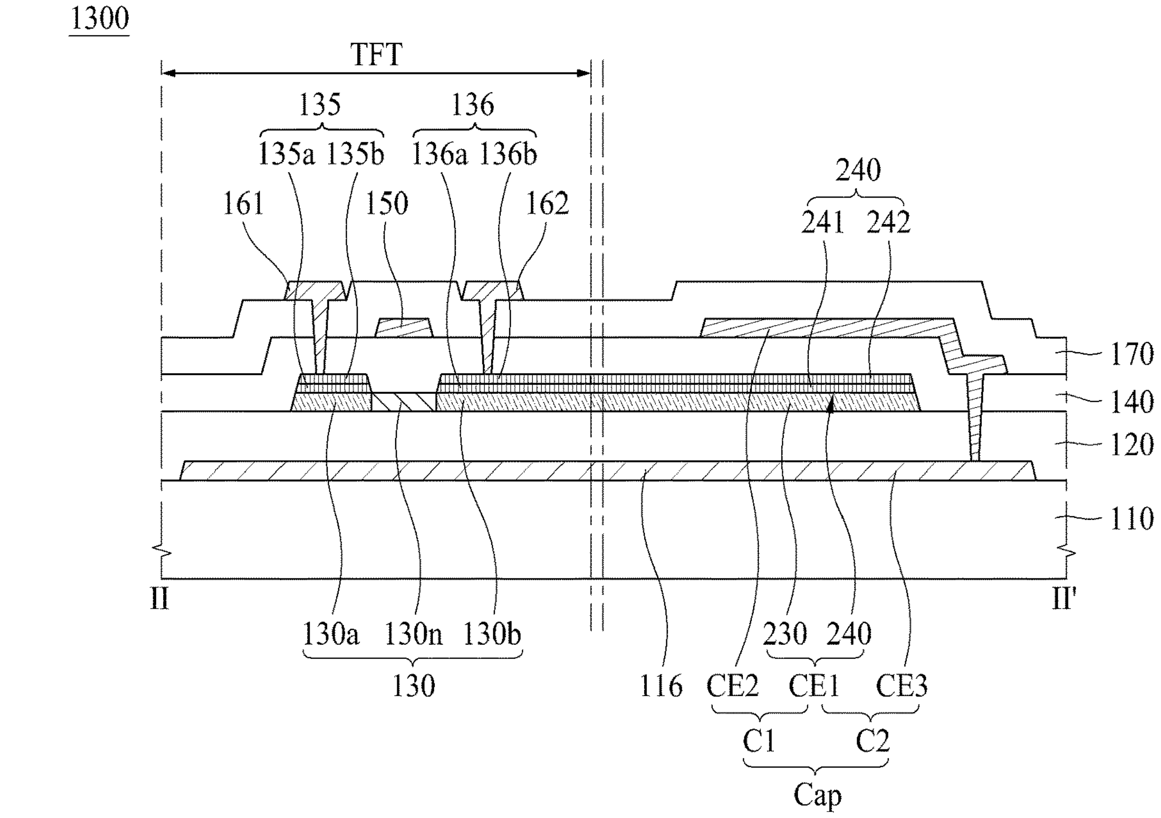
FIG. 13 is a cross-sectional view illustrating a thin film transistor substrate according to further still another embodiment of the present disclosure.

FIG. 13 is a cross-sectional view illustrating a thin film transistor substrate 1300 according to further still another embodiment of the present disclosure.

Referring to FIG. 13, the reducing material layers 135 and 136 can include metal layers 135*a* and 136*a* and metal oxide layers 135*b* and 136*b* on the metal layers 135*a* and 136*a*.

The metal-containing layer 240 can also include a metal layer 241 and a metal oxide layer 242 on the metal layer 241.

The reducing material layers 135 and 136 and the metal-containing layer 240 can be formed together by the same method using the same material.

The metal layer 136*a* and the metal oxide layer 136*b*, which constitute the reducing material layer 136 on the second connection portion 130*b*, can be integrated with the metal layer 241 and the metal oxide layer 242, which constitute the metal-containing layer 240, respectively.

A method of manufacturing a thin film transistor substrate 300 according to further still another embodiment of the present disclosure will be described with reference to FIGS. 14A to 14I.

FIGS. 14A to 14I are process views illustrating a method of manufacturing a thin film transistor substrate 300 according to further still another embodiment of the present disclosure.

Figure 14A:
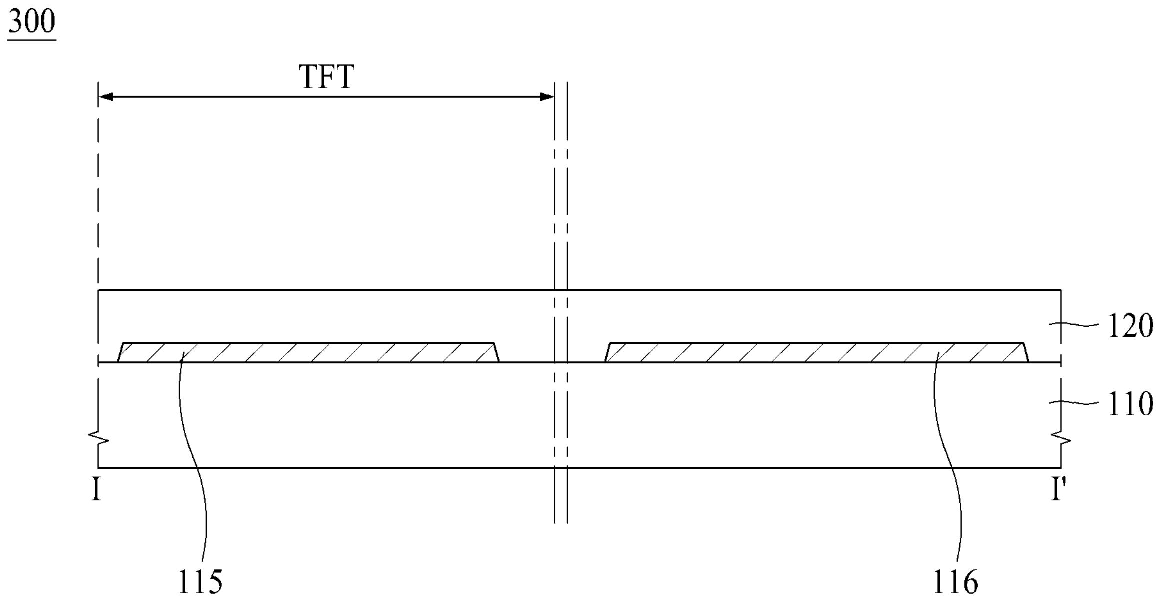
FIGS. 14A to 14I are process views illustrating a method of manufacturing a thin film transistor substrate according to an embodiment of the present disclosure.

Referring to FIG. 14A, light shielding layers 115 and 116 are formed on a base substrate 110, and a buffer layer 120 is formed on the light shielding layers 115 and 116.

Figure 14B:
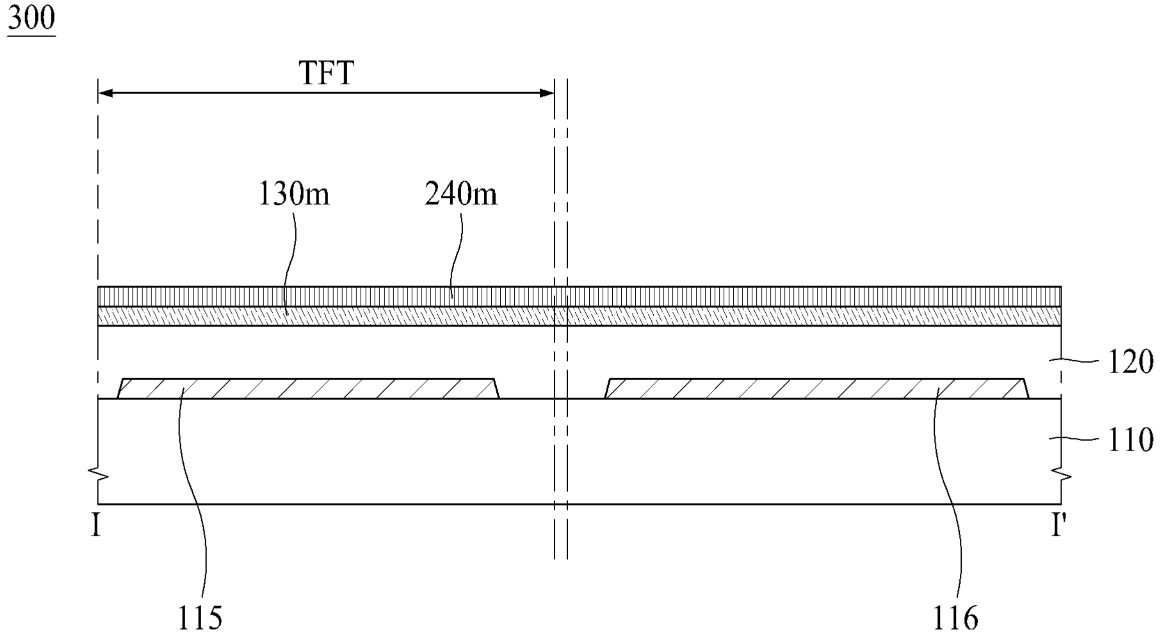

Referring to FIG. 14B, an oxide semiconductor material layer 130*m* and a metal material layer 240*m* are formed on the buffer layer 120.

Figure 14C:
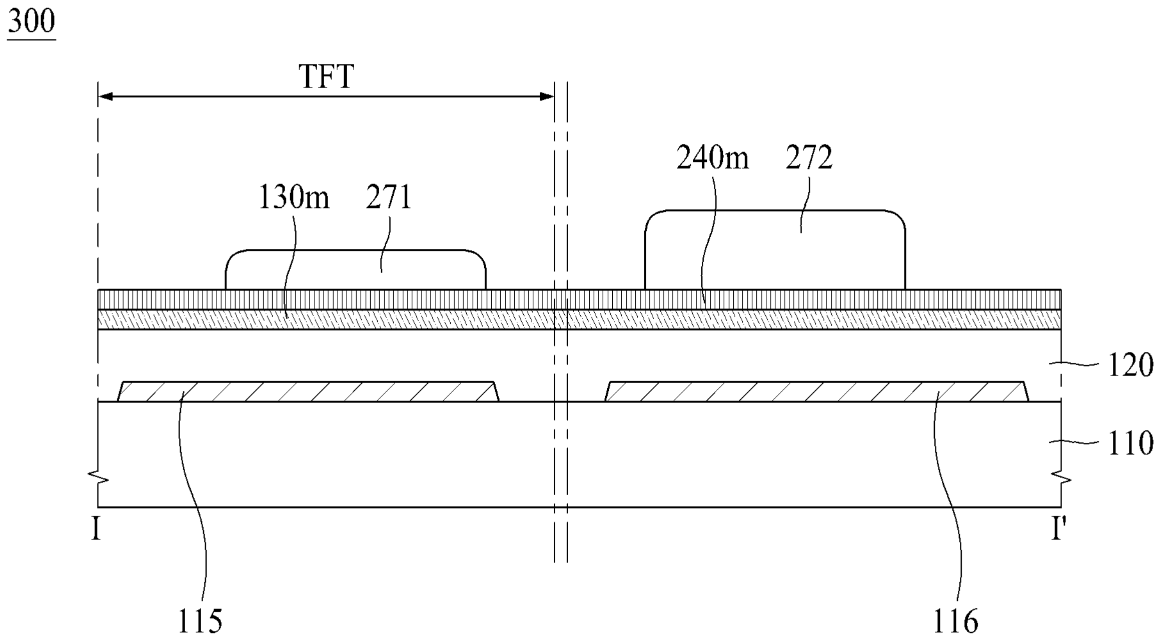

Referring to FIG. 14C, photoresist patterns 271 and 272 are formed on the metal material layer 240*m*. The first photoresist pattern 271 and the second photoresist pattern 272 having their respective thicknesses different from each other can be formed by exposure using a half-tone mask.

Figure 14D:
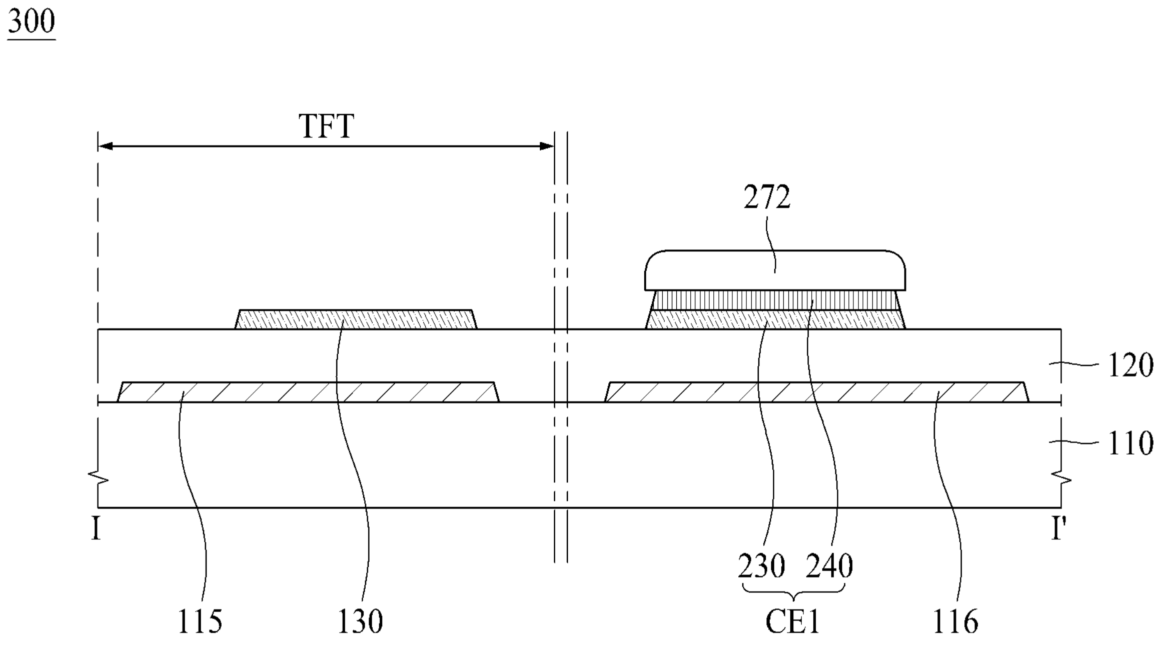

Referring to FIG. 14D, the active layer 130 of the thin film transistor TFT and the first capacitor electrode CE1 of the capacitor Cap are formed by etching using the photoresist patterns 271 and 272.

The metal material layer 240*m* is removed from the lower portion of the first photoresist pattern 271 having a small thickness, so that the active layer 130 is formed.

The oxide semiconductor material layer 130*m* and the metal material layer 240*m* are not removed from the lower portion of the second photoresist pattern 272 having a great thickness, so that the first capacitor electrode CE1 is formed. The active material layer 230 is formed by the oxide semiconductor material layer 130*m*, and the metal-containing layer 240 is formed by the metal material layer 240*m*.

Figure 14E:
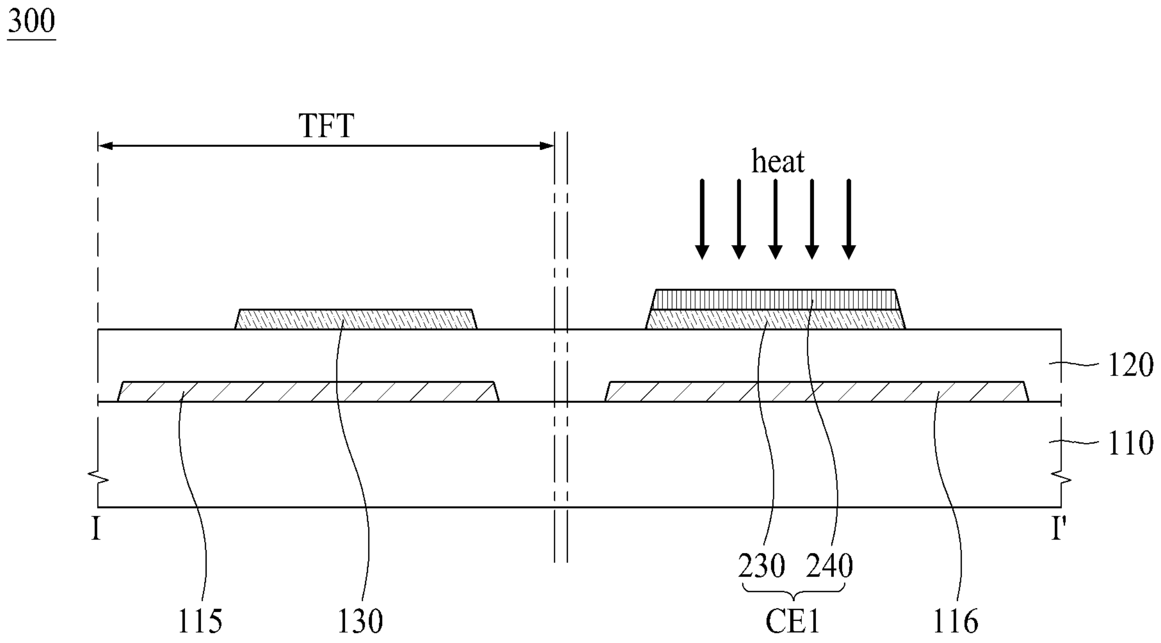

Referring to FIG. 14E, a heat-treatment is performed. The heat-treatment can be performed on the entire upper surface of the base substrate 110. The upper portion of the metal-containing layer 240 can be oxidized by the heat-treatment. The heat-treatment can be performed at a temperature of 100° C. to 500° C. (e.g., at 300° C.), for example. In more detail, the heat-treatment can be performed at a temperature of 100° C. to 400° C., can be performed at a temperature of 200° C. to 500° C., can be performed at a temperature of 100° C. to 300° C., or can be performed at a temperature of 200° C. to 300° C. (e.g., at 250° C.).

Figure 14F:
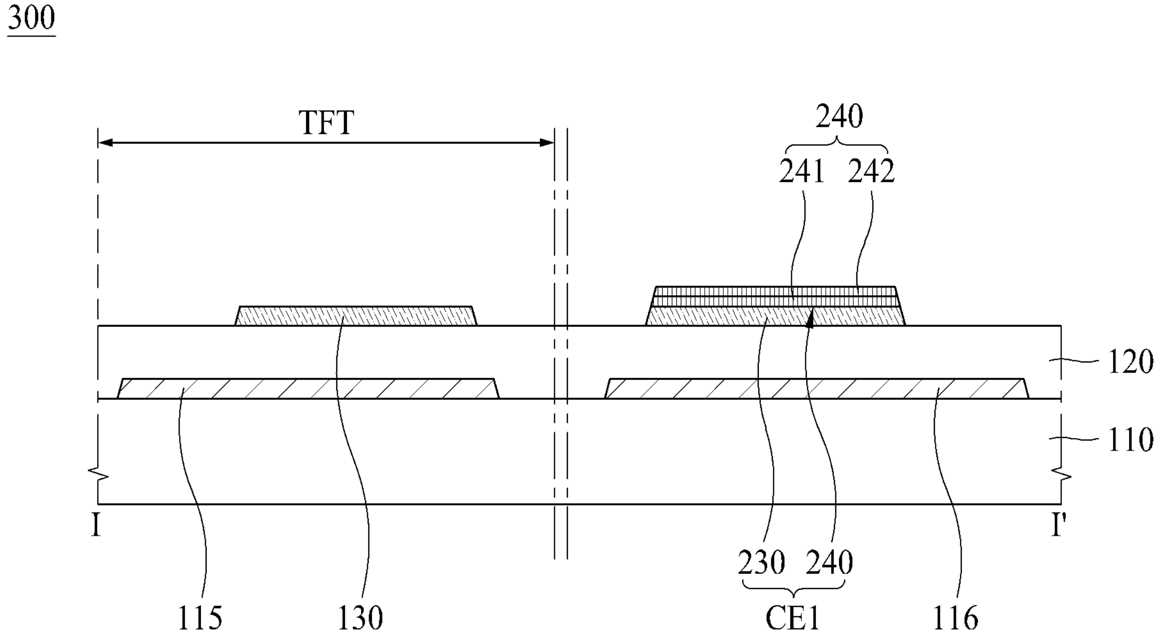

Referring to FIG. 14F, the metal-containing layer 240 can be separated into the metal layer 241 and the metal oxide layer 242 by the heat-treatment. The metal oxide layer 242 has an oxygen concentration higher than that of the metal layer 241.

However, embodiments of the present disclosure is not limited to the above example, and the upper portion of the metal-containing layer 240 can be oxidized by a plasma treatment or other coating methods. For example, the metal-containing layer 240 and the metal oxide layer 242 can be formed separately by an oxygen ($O_2$) plasma treatment.

Figure 14G:
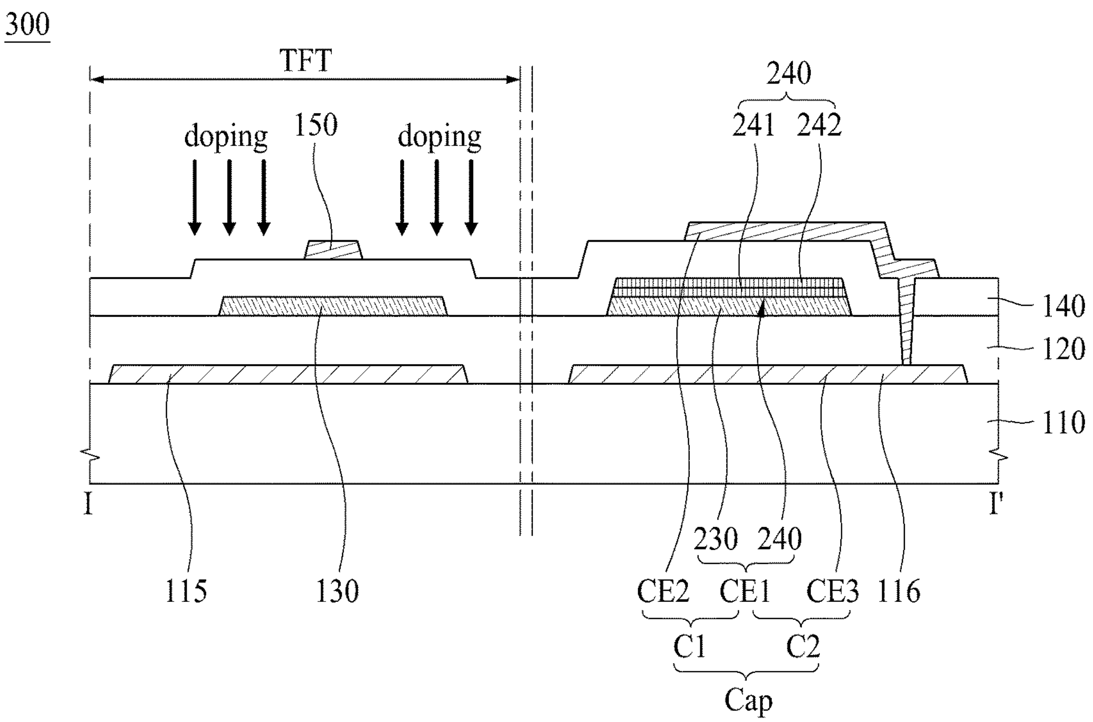

Referring to FIG. 14G, the gate insulating layer 140 can be formed on the active layer 130 and the first capacitor electrode CE1, and a gate electrode 150 and a second capacitor electrode CE2 can be formed on the gate insulating layer 140. The gate electrode 150 and the second capacitor electrode CE2 can be formed together.

In addition, the second capacitor electrode CE2 and the light shielding layer 116 disposed below the first capacitor electrode CE1 can be connected to each other by a contact hole. The light shielding layer 116 connected to the second capacitor electrode CE2 can be a third capacitor electrode CE3.

As a result, a first capacitor C1 can be formed by overlap between the first capacitor electrode CE1 and the second capacitor electrode CE2, and a second capacitor C2 can be formed by overlap between the first capacitor electrode CE1 and the third capacitor electrode CE3 (e.g., CE1 is between CE2 and CE3). According to one embodiment of the present disclosure, the capacitor Cap can include a first capacitor C1 and a second capacitor C2.

Referring to FIG. 14G, the active layer 130 can be selectively conductorized by doping using the gate electrode 150 as a mask. In detail, the active layer 130 can be selectively conductorized by ion doping. Boron (B), phosphorus (P), fluorine (F), hydrogen (H), or their ions can be used as dopants for ion doping.

Figure 14H:
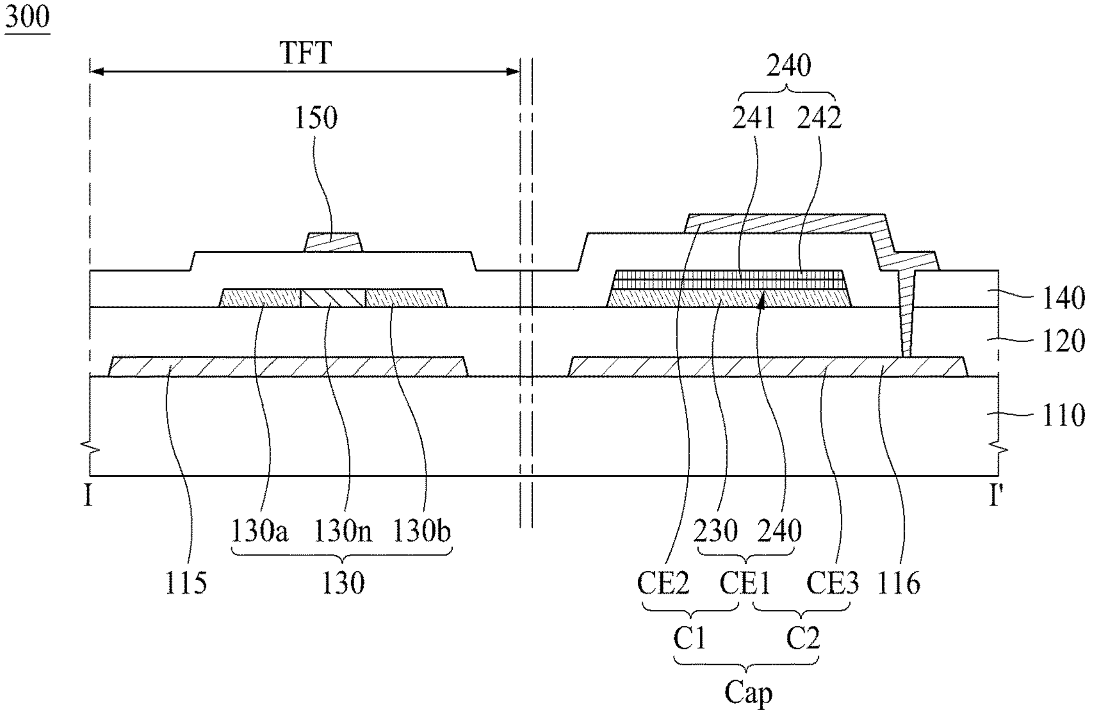

As a result, as shown in FIG. 14H, the first connection portion 130*a* and the second connection portion 130*b* can be formed.

Figure 14I:
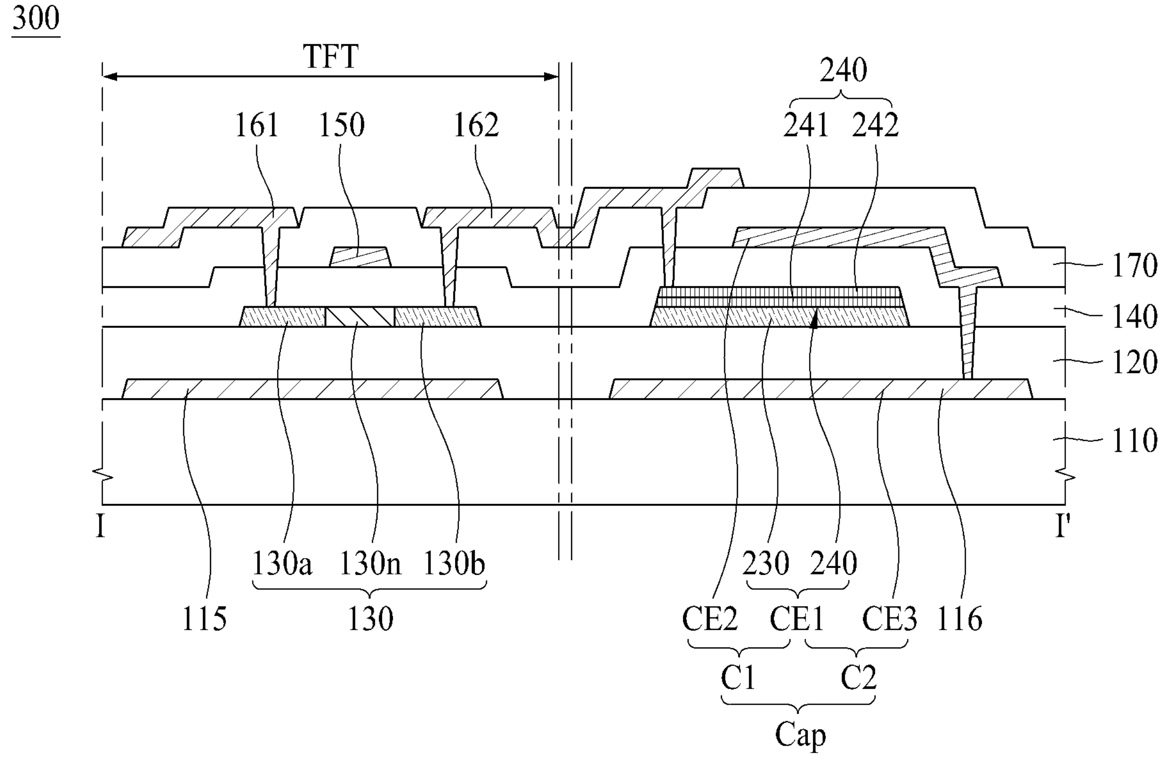

Referring to FIG. 14I, an interlayer insulating layer 170 is formed on the gate electrode 150 and the second capacitor electrode CE2, and a source electrode 161 and a drain electrode 162 are formed on the interlayer insulating layer 170.

Referring to FIG. 14I, the source electrode 161 and the drain electrode 162 are connected to the active layer 130 through the contact hole, respectively. The source electrode 161 can be connected to the light shielding layer 115 below the active layer 130 through the contact hole.

The active layer 130 and the first capacitor electrode CE1 can be connected to each other through the drain electrode 162.

As a result, according to further still another embodiment of the present disclosure, the thin film transistor substrate 300, which includes a thin film transistor TFT and a capacitor Cap, can be formed.

Hereinafter, the display device to which the above-described thin film transistor substrates 100, 201, 202, 300, 400, 500, 600, 700, 800, 900, 1000, 1100, 1200 and 1300 are applied will be described in detail.

Figure 15:
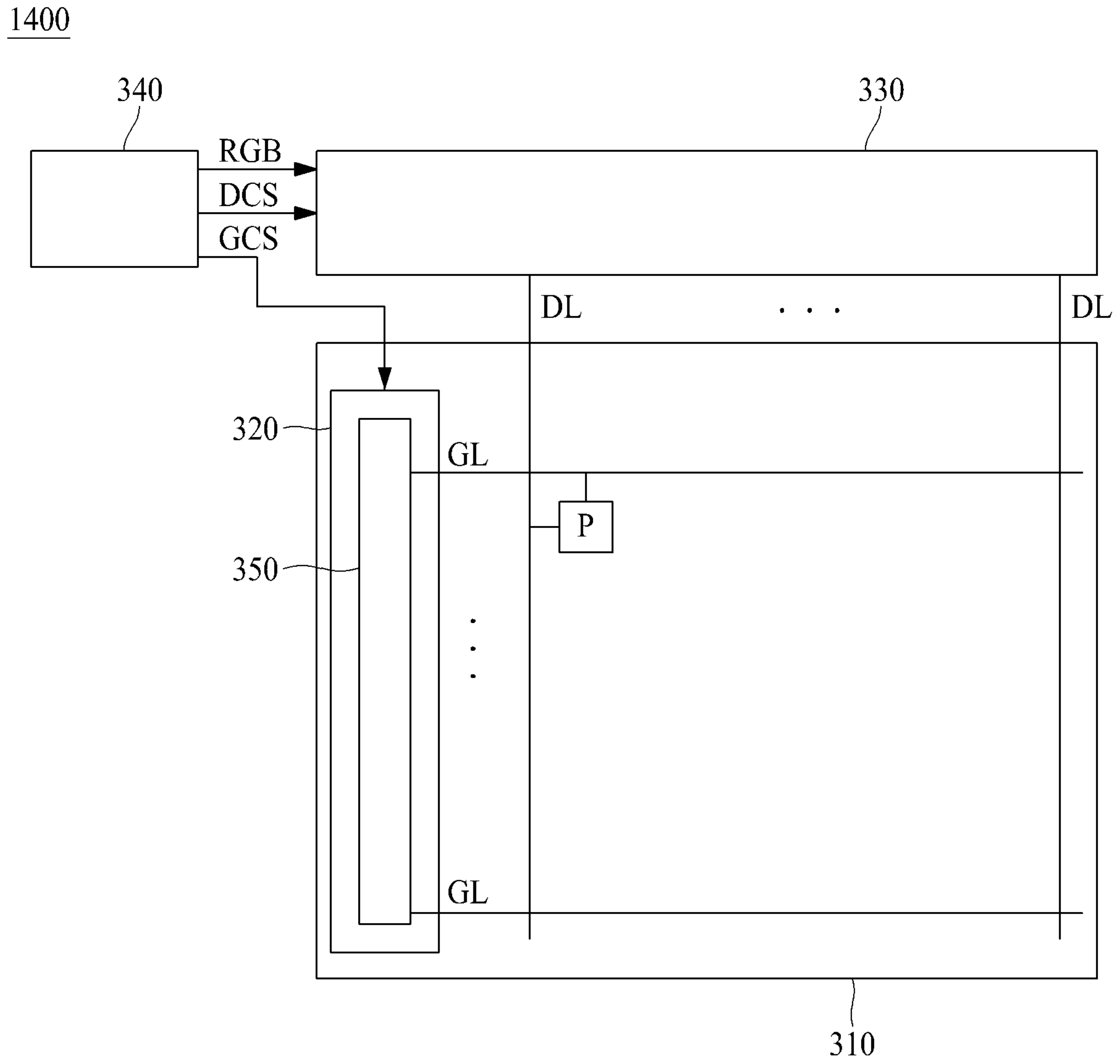
FIG. 15 is a schematic view illustrating a display device according to and embodiment of the present disclosure.

FIG. 15 is a schematic view illustrating a display device 1400 according to further still another embodiment of the present disclosure.

The display device 1400 according to further still another embodiment of the present disclosure can include a display panel 310, a gate driver 320, a data driver 330 and a controller 340.

Gate lines GL and data lines DL are disposed in the display panel 310, and pixels P are disposed in intersection areas between the gate lines GL and the data lines DL. An image is displayed by driving of the pixel P.

The controller 340 controls the gate driver 320 and the data driver 330.

The controller 340 outputs a gate control signal GCS for controlling the gate driver 320 and a data control signal DCS for controlling the data driver 330 by using signals supplied from an external system. Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register can be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 to an analog data voltage and supplies the data voltage to the data lines DL.

The gate driver 320 can include a shift register 350.

The shift register 350 sequentially supplies gate pulses to the gate lines GL for one frame by using the start signal and the gate clock, which are transmitted from the controller 340. In this situation, one frame means a period at which one image is output through the display panel 310. The gate pulse has a turn-on voltage for turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 can be packaged on the display panel 310. In this way, a structure in which the gate driver 320 is directly packaged on the display panel 310 will be referred to as a Gate In Panel (GIP) structure.

Figure 16:
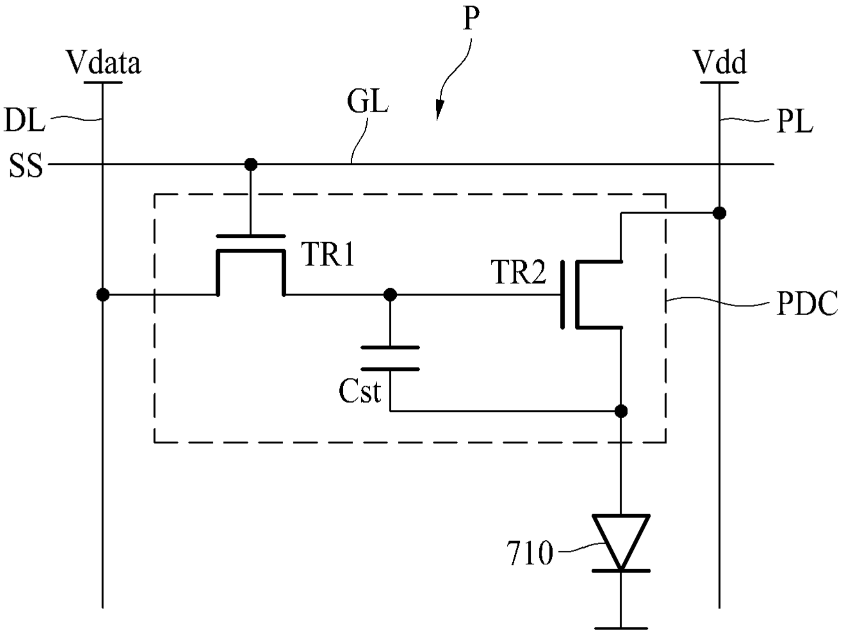
FIG. 16 is a circuit diagram of any one pixel in FIG. 15 according to an embodiment of the present disclosure.
Figure 17:
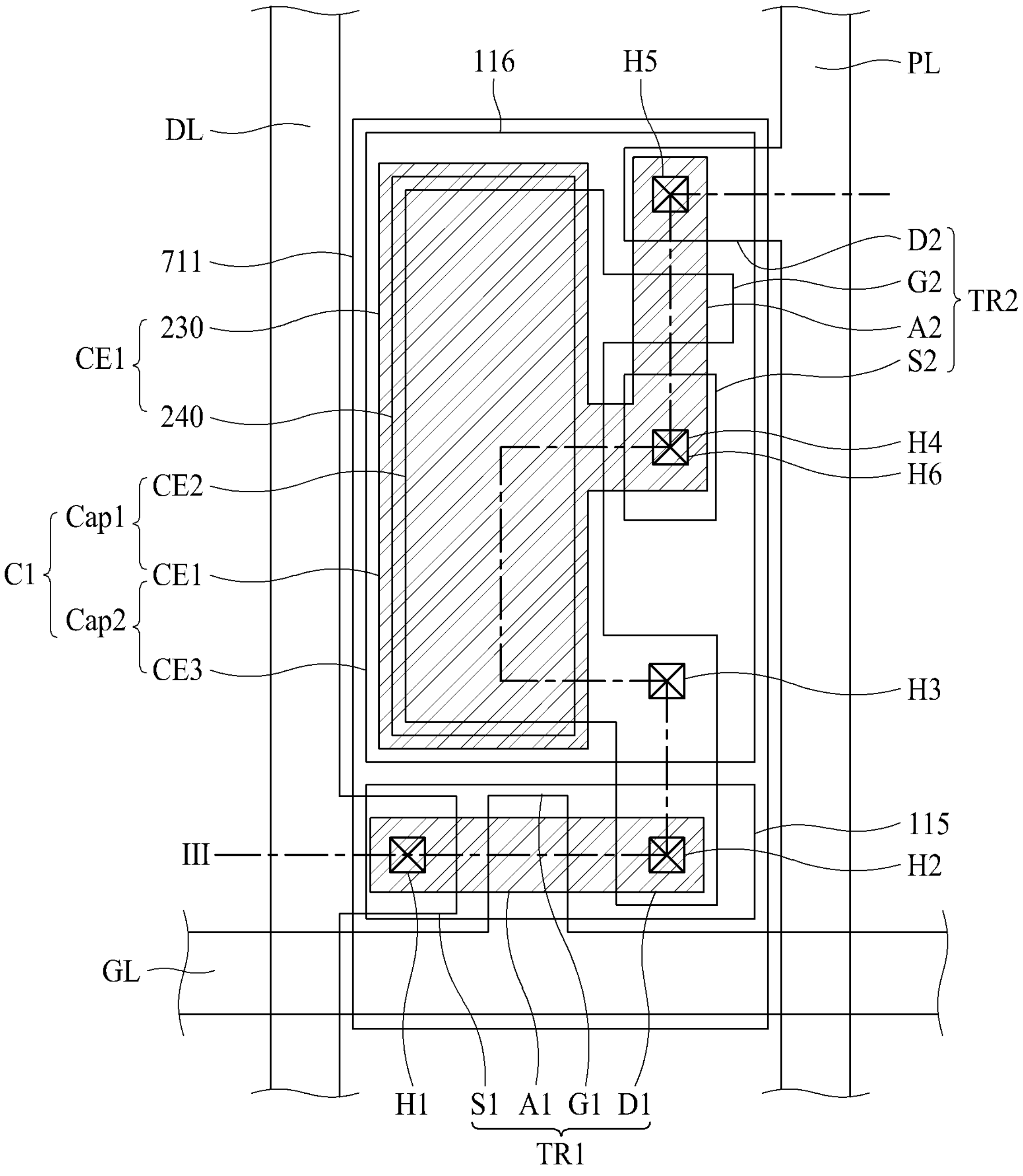
FIG. 17 is a plan view illustrating the pixel of FIG. 16 according to an embodiment of the present disclosure.
Figure 18:
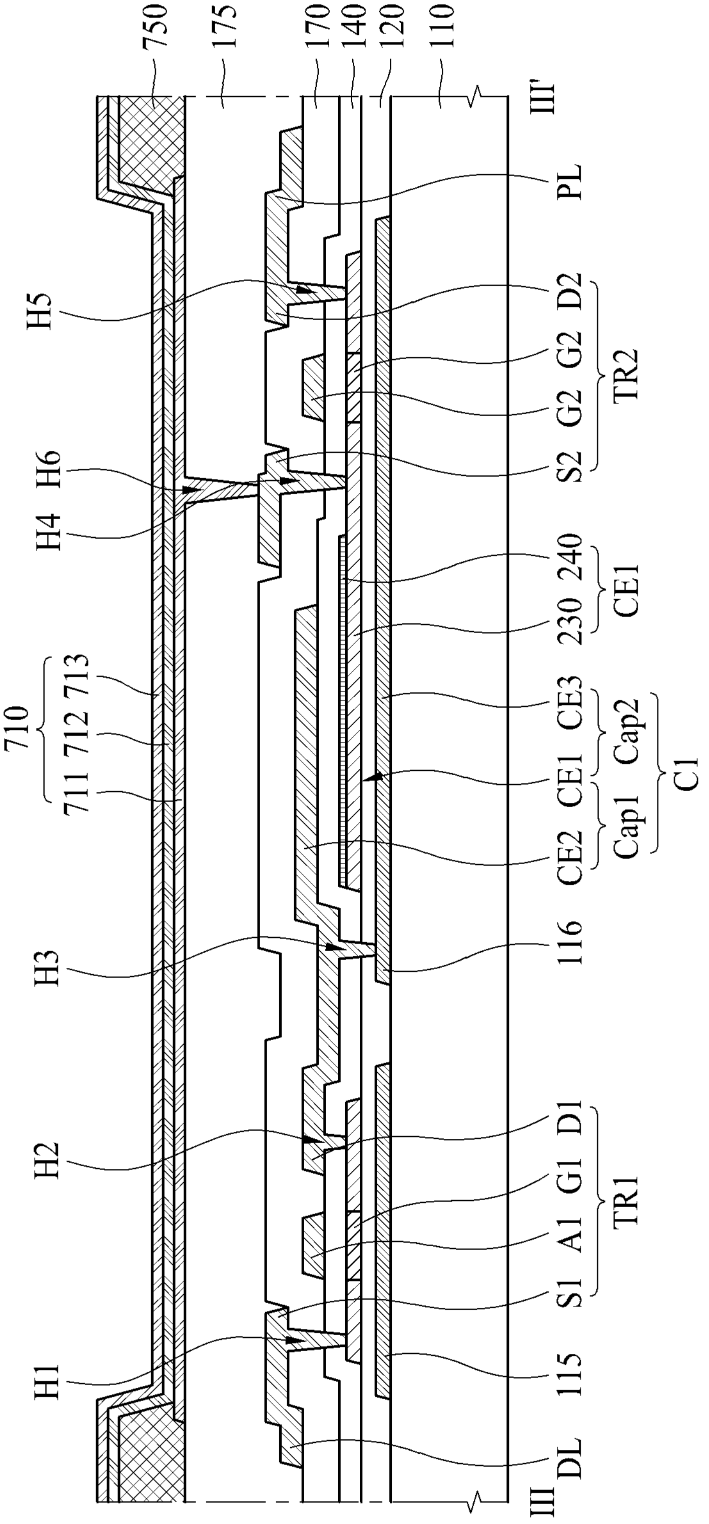
FIG. 18 is a cross-sectional view taken along line III-III' of FIG. 17 according to an embodiment of the present disclosure.

FIG. 16 is a circuit diagram of any one pixel Pin FIG. 15, FIG. 17 is a plan view illustrating the pixel P of FIG. 16, and FIG. 18 is a cross-sectional view taken along line III-III' of FIG. 17.

The circuit diagram of FIG. 16 is an equivalent circuit diagram for the pixel P of the display device 1400 that includes an organic light emitting diode (OLED) as a display element 710.

The pixel P includes a display element 710, and a pixel driving circuit PDC for driving the display element 710.

The pixel driving circuit PDC of FIG. 16 includes a first thin film transistor TR1 that is a switching transistor, and a second thin film transistor TR2 that is a driving transistor.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a storage capacitor Cst formed between the gate electrode G2 and a source electrode S2 of the second thin film transistor TR2.

The amount of a current supplied to the organic light emitting diode (OLED) that is the display element 710 through the second thin film transistor TR2 is controlled in accordance with the data voltage Vdata, whereby a gray scale of light emitted from the display element 710 can be controlled.

Referring to FIGS. 17 and 18, the first thin film transistor TR1, the second thin film transistor TR2, and the storage capacitor Cst are disposed on the base substrate 110.

The thin film transistor TFT of the above-described thin film transistor substrates 100, 201, 202, 300, 400, 500, 600, 700, 800, 900, 1000, 1100, 1200 and 1300 can be applied to at least one of the first thin film transistor TR1 and the second thin film transistor TR2 of the display device 1400. The capacitor Cap of the above-described thin film transistor substrates 100, 201, 202, 300, 400, 500, 600, 700, 800, 900, 1000, 1100, 1200 and 1300 can be applied to the capacitor Cst of the display device 1400.

The base substrate 110 can be made of glass or plastic. Plastic having a flexible property, for example, polyimide (PI) can be used as the base substrate 110.

Referring to FIGS. 17 and 18, the light shielding layers 115 and 116 can be disposed on the base substrate 110.

The light shielding layers 115 and 116 can have light shielding characteristics. The light shielding layers 115 and 116 can shield light incident from the outside to protect active layers A1 and A2 and reduce reflections and glare.

A buffer layer 120 is disposed on the light shielding layers 115 and 116. The buffer layer 120 is made of an insulating material, and protects the active layers A1 and A2 from external water or oxygen.

The active layer A1 of the first thin film transistor TR1 and the active layer A2 of the second thin film transistor TR2 are disposed on the buffer layer 120. The active layers A1 and A2 can include, for example, an oxide semiconductor material.

The first capacitor electrode CE1 is disposed on the buffer layer 120. The first capacitor electrode CE1 includes an active material layer 230 and a metal-containing layer 240. The active material layer 230 can be formed of the same material as that of the active layer A2 of the second thin film transistor TR2. The active layer A2 of the second thin film transistor TR2 and the active material layer 230 can be integrally formed.

A gate insulating layer 140 is disposed on the active layers A1 and A2 and the first capacitor electrode CE1.

The gate electrodes G1 and G2 are disposed on the gate insulating layer 140.

Also, a drain electrode D1 of the first thin film transistor TR1 can be disposed on the gate insulating layer 140. The drain electrode D1 of the first thin film transistor TR1 can be connected to the active layer A1 of the first thin film transistor TR1 through a second contact hole H2.

The drain electrode D1 of the first thin film transistor TR1 can be formed of the same material as that of the gate electrodes G1 and G2.

The second capacitor electrode CE2 is disposed on the gate insulating layer 140. The second capacitor electrode CE2 can be integrally formed with the drain electrode D1 of the first thin film transistor TR1. The drain electrode D1 of the first thin film transistor TR1 can be extended to become the second capacitor electrode CE2.

In addition, the second capacitor electrode CE2 can be integrally formed with the gate electrode G2 of the second thin film transistor TR2. The second capacitor electrode CE2 can be extended to become the gate electrode G2 of the second thin film transistor TR2.

According to further still another embodiment of the present disclosure, the drain electrode D1 of the first thin film transistor TR1, the second capacitor electrode CE2, and the gate electrode G2 of the second thin film transistor TR2 can be integrally formed.

The second capacitor electrode CE2 can be connected to the light shielding layer 116 disposed below the first capacitor electrode CE1 through a third contact hole H3. The light shielding layer 116 connected to the second capacitor electrode CE2 can be the third capacitor electrode CE3.

The first capacitor C1 can be formed by the first capacitor electrode CE1 and the second capacitor electrode CE2, and the second capacitor C2 can be formed by the first capacitor electrode CE1 and the third capacitor electrode CE3. As a result, the storage capacitor Cst can be formed. The storage capacitor Cst can include a first capacitor C1 and a second capacitor C2.

The interlayer insulating layer 170 is disposed on the gate electrodes G1 and G2, the drain electrode D1 of the first thin film transistor TR1, and the second capacitor electrode CE2. The interlayer insulating layer 170 can have a single layered structure, or can have a multi-layered structure.

The data line DL, the driving power line PL, the source electrode S1 and S2, and the drain electrode D2 of the second thin film transistor TR2 can be disposed on the interlayer insulating layer 170.

The source electrode S1 of the first thin film transistor TR1 can be integrated with the data line DL. A portion of the data line DL can be extended to become the source electrode S1 of the first thin film transistor TR1.

The source electrode S1 of the first thin film transistor TR1 can be connected to the active layer A1 of the first thin film transistor TR1 through a first contact hole H1.

The drain electrode D2 of the second thin film transistor TR2 can be integrated with the driving power line PL. A portion of the driving power line PL can be extended to become the drain electrode D2 of the second thin film transistor TR2.

The drain electrode D2 of the second thin film transistor TR2 can be connected to the active layer A2 of the second thin film transistor TR2 through a fifth contact hole H5.

The source electrode S2 of the second thin film transistor TR2 can be connected to the active layer A2 of the second thin film transistor TR2 through a fourth contact hole H4.

A planarization layer 175 is disposed on the data line DL, the driving power line PL, the source electrodes S1 and S2, and the drain electrode D2 of the second thin film transistor TR2. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 can be connected to the source electrode S2 of the second thin film transistor TR2 through a sixth contact hole H6 formed in the planarization layer 175.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 18 is an organic light emitting diode (OLED).

Therefore, the display device 100 according to one embodiment of the present disclosure is an organic light emitting display device.

Figure 19:
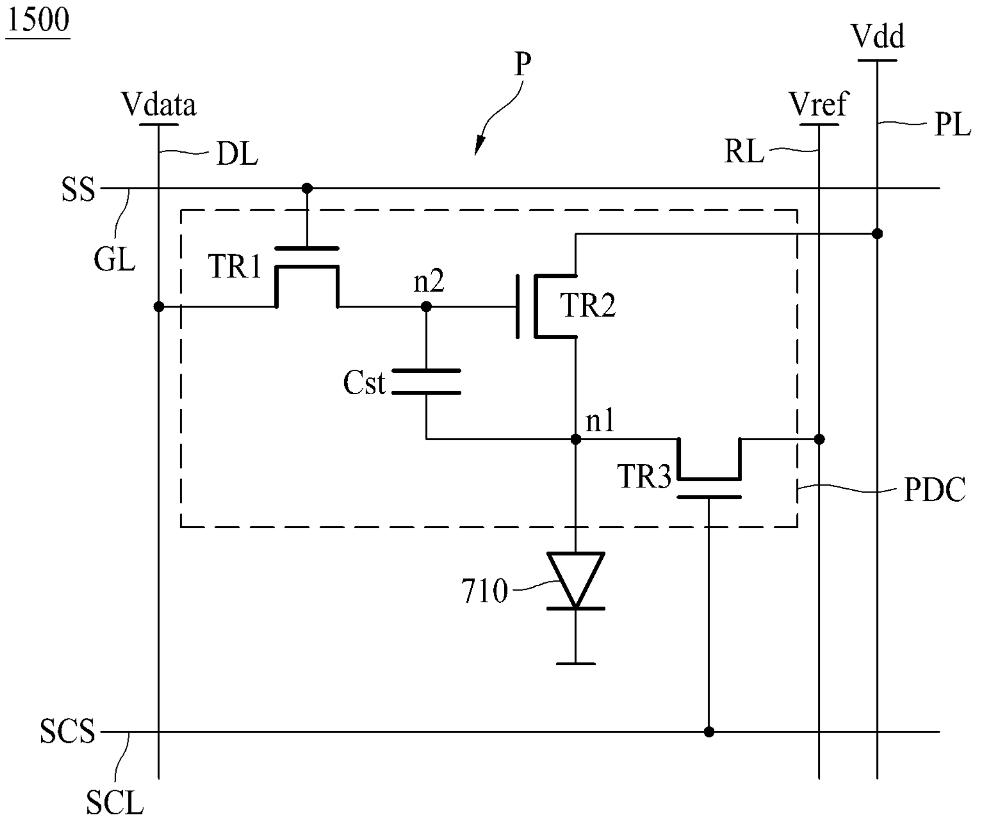
FIG. 19 is a circuit diagram illustrating any one pixel of a display device according to another embodiment of the present disclosure.

FIG. 19 is a circuit diagram illustrating any one pixel P of a display device 1500 according to further still another embodiment of the present disclosure.

FIG. 19 is an equivalent circuit diagram for a pixel P of an organic light emitting display device.

The pixel P of the display device 1000 shown in FIG. 19 includes an organic light emitting diode (OLED) that is a display element 710, and a pixel driving circuit PDC driving the display element 710. The display element 710 is connected to the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to the reference line RL, and a sensing control signal SCS is supplied to the sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (sensing transistor) for sensing characteristics of the second thin film transistor TR2.

The first thin film transistor TR1 is turned on by the scan signal SS supplied to the gate line GL to transmit the data voltage Vdata, which is supplied to the data line DL, to the gate electrode of the second thin film transistor TR2.

The storage capacitor Cst is positioned between the gate electrode of the second thin film transistor TR2 and the display element 710.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the first thin film transistor TR1. The storage capacitor Cst is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 20:
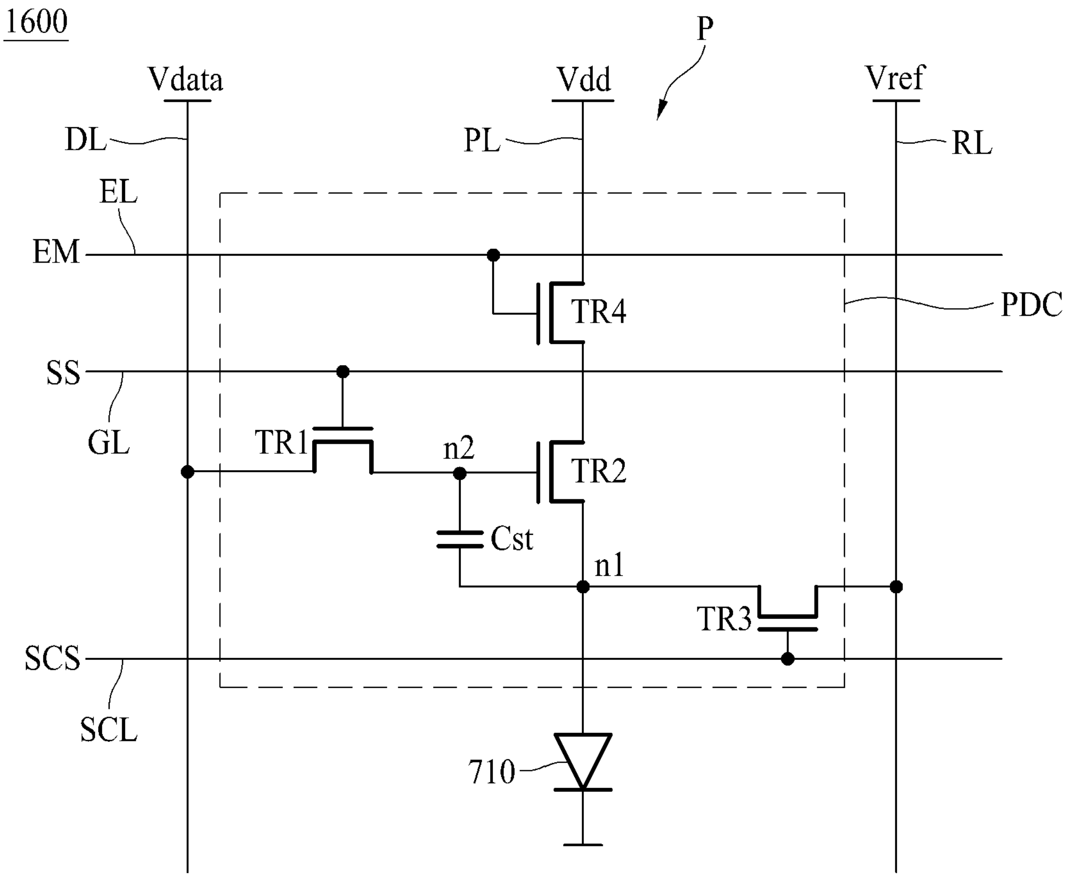
FIG. 20 is a circuit diagram illustrating any one pixel of a display device according to an embodiment of the present disclosure.

FIG. 20 is a circuit diagram illustrating any one pixel of a display device 1600 according to further still another embodiment of the present disclosure.

The pixel P of the display device 1600 shown in FIG. 20 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 19, the pixel P of FIG. 20 further includes an emission control line EL. An emission control signal EM is supplied to the emission control line EL.

Also, the pixel driving circuit PDC of FIG. 20 further includes a fourth thin film transistor TR4 that is an emission control transistor for controlling a light emission timing of the second thin film transistor TR2, in comparison with the pixel driving circuit PDC of FIG. 19.

A storage capacitor Cst is positioned between the gate electrode of the second thin film transistor TR2 and the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period (e.g., for sensing voltage threshold, mobility, OLED degradation, etc.).

The fourth thin film transistor TR4 transfers the driving voltage Vdd to the second thin film transistor TR2 in accordance with the emission control signal EM or shields the driving voltage Vdd. When the fourth thin film transistor is turned on, a current is supplied to the second thin film transistor TR2, whereby light is output from the display element 710.

The pixel driving circuit PDC according to further still another embodiment of the present disclosure can be formed in various structures in addition to the above-described structure. The pixel driving circuit PDC can include, for example, five or more thin film transistors.

According to the present disclosure, the following advantageous effects can be obtained.

According to one embodiment of the present disclosure, since the capacitor electrode and the active layer are protected by the metal-containing layer which can absorb or block hydrogen, the capacitor and the thin film transistor can have excellent stability.

According to one embodiment of the present disclosure, as the oxide semiconductor layer is protected by the metal-containing layer, stability of the capacitor, which includes a capacitor electrode formed of an oxide semiconductor layer and a metal-containing layer, can be improved.

In addition, according to one embodiment of the present disclosure, a portion of the oxide semiconductor layer is protected by the metal-containing layer, so that the thin film transistor including the oxide semiconductor layer as the active layer can have excellent stability.

According to one embodiment of the present disclosure, since the metal containing layer including the metal oxide serves to capture or block hydrogen, the driving characteristics of the capacitor and the thin film transistor are not changed, whereby driving stability of the capacitor and the thin film transistor can be improved and the lifespan of the device can be extended.

As described above, the display device including the capacitor and the thin film transistor, which have stability with respect to hydrogen, can have excellent stability without change of display quality.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor substrate comprising:

a thin film transistor on a base substrate;

a capacitor connected to the thin film transistor;

a first light shielding layer disposed between the base substrate and the thin film transistor; and a second light shielding layer disposed between the base substrate and at least a portion of the capacitor, the second light shielding layer being spaced apart from the first light shielding layer, wherein the thin film transistor includes:

an active layer on the base substrate; and a gate electrode spaced apart from the active layer to at least partially overlap the active layer, wherein the capacitor includes:

a first capacitor electrode disposed on a same layer as the active layer of the thin film transistor; and a second capacitor electrode disposed on a same layer as the gate electrode and overlapping with the first capacitor electrode, wherein the capacitor further includes a third capacitor electrode, and the first capacitor electrode is disposed between the second capacitor electrode and the third capacitor electrode, wherein the third capacitor electrode includes the second light shielding layer, and wherein the first capacitor electrode is connected to a drain electrode of the thin film transistor or a source electrode of the thin film transistor, and the second capacitor electrode is connected to the gate electrode of the thin film transistor, wherein the first capacitor electrode overlaps with the second capacitor electrode and the third capacitor electrode, wherein the first capacitor electrode includes:

an active material layer made of a same material as the active layer of the thin film transistor; and a metal-containing layer disposed on the active material layer, and including a metal different than the active material layer, and wherein the active material layer and the metal-containing layer directly contact each other within an area where the first capacitor electrode, the second capacitor electrode, and the third capacitor electrode overlap with each other.

2. The thin film transistor substrate of claim 1, wherein the metal-containing layer in the first capacitor electrode includes:

a metal layer disposed on the active material layer; and a metal oxide layer disposed on the metal layer.

3. The thin film transistor substrate of claim 2, wherein the metal oxide layer in the first capacitor electrode is configured to absorb hydrogen for protecting the active layer of the thin film transistor.

4. The thin film transistor substrate of claim 1, wherein the second capacitor electrode is made of a same material as the gate electrode.

5. The thin film transistor substrate of claim 1, wherein the active layer is connected to one of the first capacitor electrode and the second capacitor electrode.

6. The thin film transistor substrate of claim 1, wherein the active layer is connected to the first capacitor electrode, and the gate electrode is connected to the second capacitor electrode.

7. The thin film transistor substrate of claim 1, wherein the active layer is connected to the second capacitor electrode.

8. The thin film transistor substrate of claim 1, wherein each of the active layer and the active material layer includes an oxide semiconductor material.

9. The thin film transistor substrate of claim 1, wherein the active layer and the active material layer include:

a first oxide semiconductor layer; and a second oxide semiconductor layer disposed on the first oxide semiconductor layer.

10. The thin film transistor substrate of claim 1, wherein the metal-containing layer includes at least one selected from titanium (Ti), zirconium (Zr), hafnium (Hf), vanadium (V), niobium (Nb), tantalum (Ta), rubidium (Rb), cesium (Cs), magnesium (Mg), calcium (Ca), strontium (Sr), lanthanum (La), or palladium (Pd).

11. The thin film transistor substrate of claim 1, wherein the active layer includes a channel portion, a first connection portion connected to a first side of the channel portion, and a second connection portion connected to a second side of the channel portion, wherein a reducing material layer is disposed on the first connection portion and the second connection portion, and wherein the reducing material layer has a same composition as the metal-containing layer.

12. The thin film transistor substrate of claim 11, wherein a portion of the reducing material layer disposed on the second connection portion is integrally formed with the metal-containing layer.

13. The thin film transistor substrate of claim 1, wherein the active layer of the thin film transistor is integrally formed with the active material layer of the first capacitor electrode.

14. The thin film transistor substrate of claim 13, wherein the active layer includes a channel portion, a first connection portion connected to a first side of the channel portion, and a second connection portion connected to a second side of the channel portion, and wherein the first connection portion and the second connection portion have a composition different than the active material layer.

15. The thin film transistor substrate of claim 14, wherein the first connection portion and the second connection portion include a dopant for ion doping.

16. The thin film transistor substrate of claim 1, wherein the gate electrode is integrally formed with the second capacitor electrode.

17. A display device comprising:

a display panel configured to display an image, the display panel including the thin film transistor substrate according to claim 1.

18. The display device of claim 17, wherein the thin film transistor is a driving transistor or a switching transistor.

19. The display device of claim 17, wherein the capacitor is a storage capacitor formed between the gate electrode of the thin film transistor and the active layer of the thin film transistor.

20. The thin film transistor substrate of claim 1, wherein the active layer of the thin film transistor is spaced apart from the active material layer of the first capacitor electrode.

* * * * *